US007088311B2

(12) United States Patent
Kasai

(10) Patent No.: US 7,088,311 B2
(45) Date of Patent: Aug. 8, 2006

(54) CURRENT GENERATING CIRCUIT, SEMICONDUCTOR INTEGRATED CIRCUIT, ELECTRO-OPTICAL DEVICE, AND ELECTRONIC APPARATUS

(75) Inventor: Toshiyuki Kasai, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 305 days.

(21) Appl. No.: 10/229,045

(22) Filed: Aug. 28, 2002

(65) Prior Publication Data

US 2003/0058199 A1 Mar. 27, 2003

(30) Foreign Application Priority Data

Aug. 29, 2001 (JP) ............................ 2001-260115
Jul. 31, 2002 (JP) ............................ 2002-223164

(51) Int. Cl.
*H01L 25/00* (2006.01)

(52) U.S. Cl. .......................... 345/51; 345/87; 345/204; 327/100; 327/108

(58) Field of Classification Search .................. 345/51, 345/55, 87, 204, 205; 327/100, 108, 156, 327/157, 278; 341/145, 156; 361/93.1
See application file for complete search history.

(56) References Cited

U.S. PATENT DOCUMENTS 4,086,428 A * 4/1978 Haass .......................... 370/284
4,996,447 A * 2/1991 Tanoi .......................... 327/566
5,001,484 A 3/1991 Weiss
5,459,465 A * 10/1995 Kagey .......................... 341/156
5,521,527 A * 5/1996 Sakata et al. ................. 326/21
5,703,587 A 12/1997 Clark et al.
5,724,036 A 3/1998 Kobayashi et al.
5,844,511 A 12/1998 Izumikawa
5,883,546 A * 3/1999 Kaminishi et al. .......... 327/565
6,020,865 A 2/2000 Okuda et al.
6,094,041 A * 7/2000 Wachter ..................... 323/315
6,094,094 A * 7/2000 Ohtake ....................... 327/560
6,225,931 B1 5/2001 Rao et al.
6,611,107 B1 * 8/2003 Mikami et al. .......... 315/169.1
6,765,560 B1 7/2004 Ozawa
2001/0024183 A1 * 9/2001 Ode et al. ..................... 345/87
2004/0043139 A1 * 3/2004 Daniels ....................... 427/66

FOREIGN PATENT DOCUMENTS

CN 1287656 A 3/2001
EP 0 930 716 A2 7/1999

* cited by examiner

*Primary Examiner*—Bipin Shalwala
*Assistant Examiner*—Vincent E. Kovalick
(74) *Attorney, Agent, or Firm*—Oliff & Berridge, PLC

(57) ABSTRACT

The invention provides a current generating circuit with a single configuration, enhanced durability, and low power consumption. A circuit block C1 appropriately selects elemental currents i11 to i14 and i1F in accordance with data (bits) S11 to S14 and S14 and generates a sub-current Iout1. Similarly, a circuit block C2 appropriately selects elemental currents i21 to i24 and i2F in accordance with bits S21 to S24 and S2F and generates a sub-current Iout2. A circuit block C3 appropriately selects elemental currents i31 to i34 and i3F in accordance with bits S31 to S34 and S3F and generates a sub-current Iout3. A circuit block C4 appropriately selects elemental currents i41 to i44 in accordance with bits S41 to S44 and generates a sub-current Iout4. These sub-currents Iout1, Iout2, Iout3, and Iout4 are combined to generate a main current Iout.

13 Claims, 20 Drawing Sheets

| GRAY LEVEL | MAIN CURRENT | GRAY LEVEL | MAIN CURRENT |
|---|---|---|---|
| 0 | 0 | 32 | 100.0 |
| 1 | 1.5 | 33 | 124.1 |
| 2 | 3.0 | 34 | 148.3 |
| 3 | 4.5 | 35 | 172.4 |
| 4 | 6.0 | 36 | 196.5 |
| 5 | 7.5 | 37 | 220.6 |
| 6 | 9.0 | 38 | 244.8 |
| 7 | 10.5 | 39 | 268.9 |
| 8 | 12.0 | 40 | 293.0 |
| 9 | 13.5 | 41 | 317.1 |
| 10 | 15.0 | 42 | 341.3 |
| 11 | 16.5 | 43 | 365.4 |
| 12 | 18.0 | 44 | 389.5 |
| 13 | 19.5 | 45 | 413.6 |
| 14 | 21.0 | 46 | 437.8 |
| 15 | 22.5 | 47 | 461.9 |
| 16 | 24.0 | 48 | 486.0 |
| 17 | 28.8 | 49 | 547.7 |
| 18 | 33.5 | 50 | 609.4 |
| 19 | 38.3 | 51 | 671.0 |
| 20 | 43.0 | 52 | 732.7 |
| 21 | 47.8 | 63 | 794.4 |
| 22 | 52.5 | 54 | 856.1 |
| 23 | 57.3 | 55 | 917.8 |
| 24 | 62.0 | 56 | 979.4 |
| 25 | 66.8 | 57 | 1041.1 |
| 26 | 71.5 | 58 | 1102.8 |
| 27 | 76.3 | 59 | 1164.5 |
| 28 | 81.0 | 60 | 1226.2 |
| 29 | 85.8 | 61 | 1287.8 |
| 30 | 90.5 | 62 | 1349.5 |
| 31 | 95.3 | 63 | 1411.2 |

[FIG. 1]
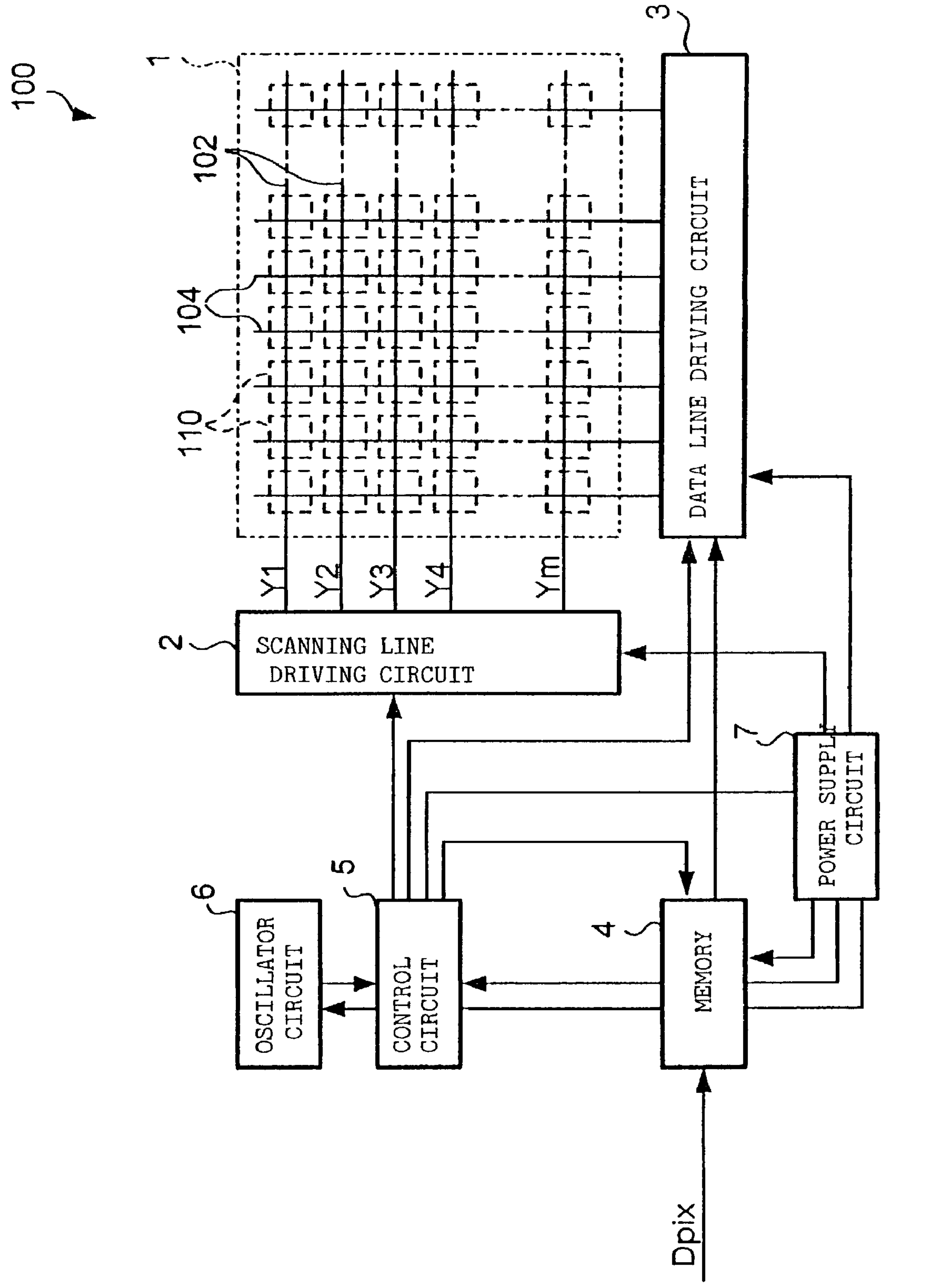

[FIG. 2]
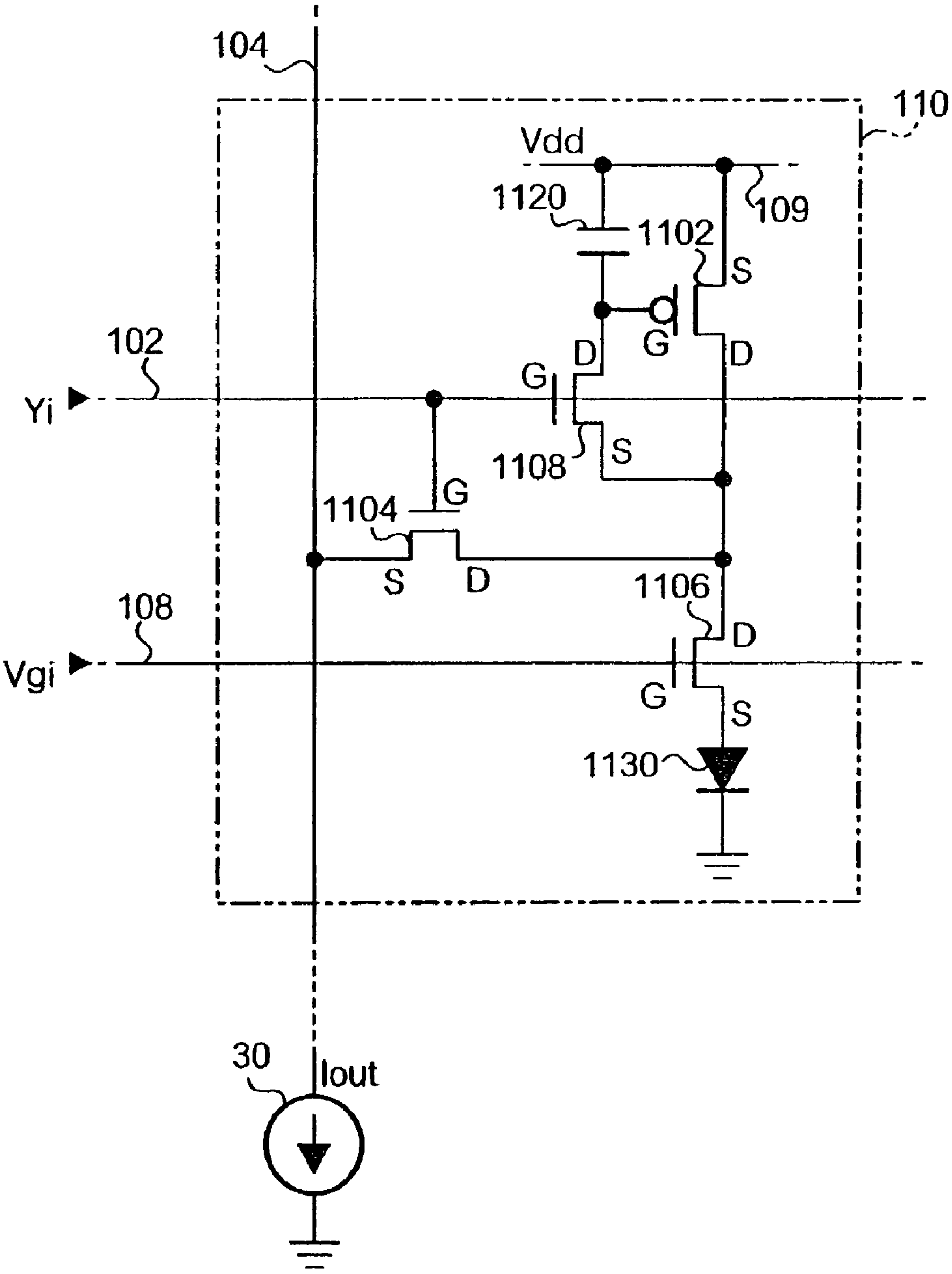

[FIG. 3]
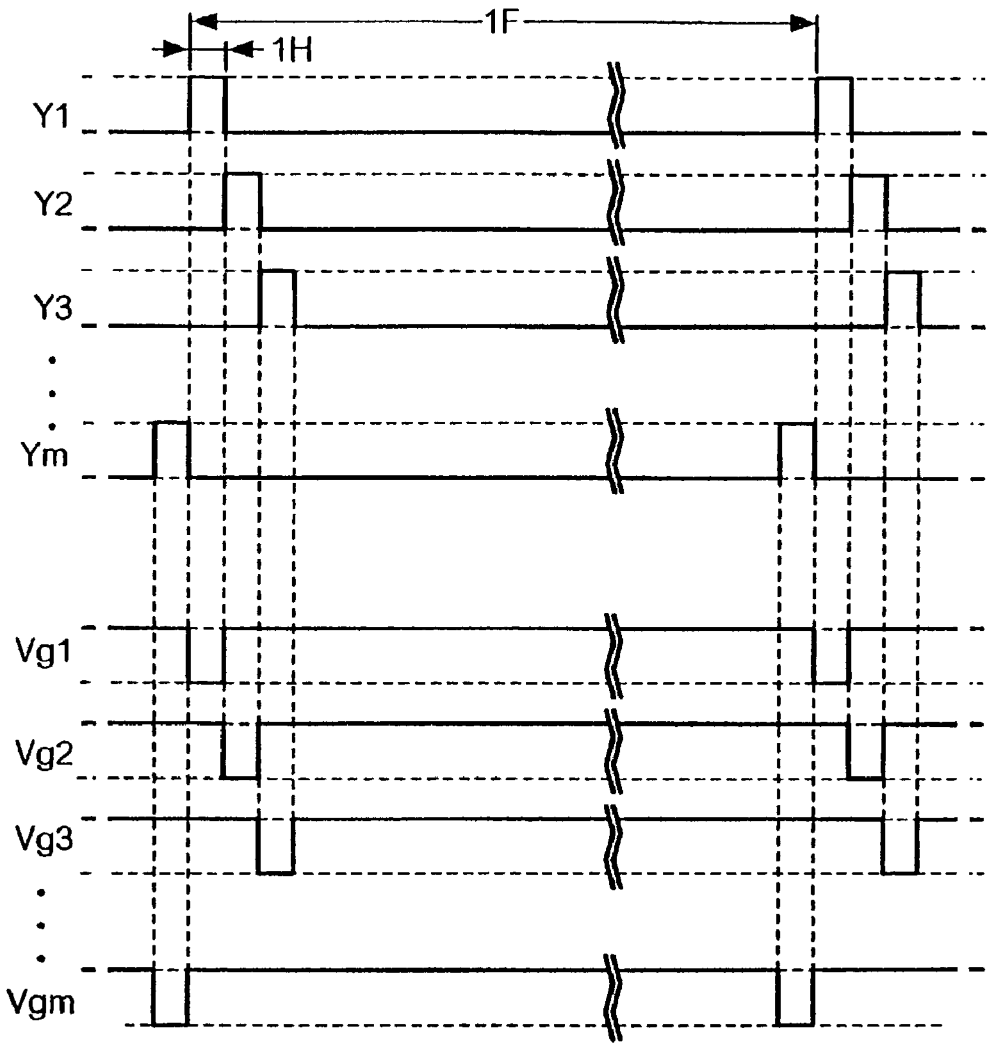

[FIG. 4]
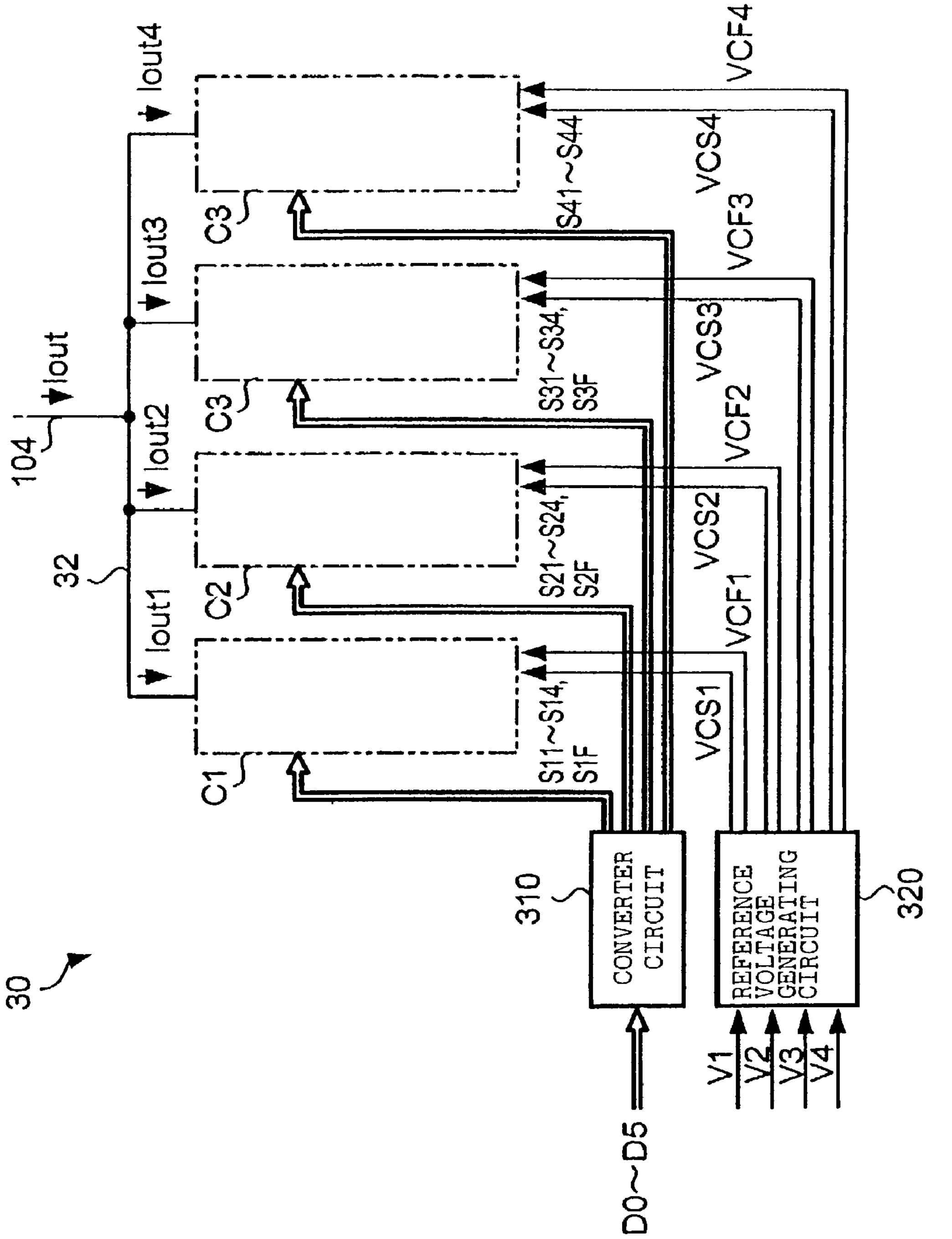

[FIG. 5]

| GRAY LEVEL | D5 | D4 | D3 | D2 | D1 | D0 | S44 | S43 | S42 | S41 | S3F | S34 | S33 | S32 | S31 | S2F | S24 | S23 | S22 | S21 | S1F | S14 | S13 | S12 | S11 |
|---|---|---|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 1 |
| 2 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 1 | 0 |
| 3 | 0 | 0 | 0 | 0 | 1 | 1 | 0 | 0 | 0 | 0 | 0 | 0 | 0 | 0 | 0 | 0 | 0 | 0 | 0 | 0 | 0 | 0 | 0 | 1 | 1 |
| 4 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 1 | 0 | 0 |
| 5 | 0 | 0 | 0 | 1 | 0 | 1 | 0 | 0 | 0 | 0 | 0 | 0 | 0 | 0 | 0 | 0 | 0 | 0 | 0 | 0 | 0 | 0 | 1 | 0 | 1 |
| 6 | 0 | 0 | 0 | 1 | 1 | 0 | 0 | 0 | 0 | 0 | 0 | 0 | 0 | 0 | 0 | 0 | 0 | 0 | 0 | 0 | 0 | 0 | 1 | 1 | 0 |
| 7 | 0 | 0 | 0 | 1 | 1 | 1 | 0 | 0 | 0 | 0 | 0 | 0 | 0 | 0 | 0 | 0 | 0 | 0 | 0 | 0 | 0 | 0 | 1 | 1 | 1 |
| 8 | 0 | 0 | 1 | 0 | 0 | 0 | 0 | 0 | 0 | 0 | 0 | 0 | 0 | 0 | 0 | 0 | 0 | 0 | 0 | 0 | 0 | 1 | 0 | 0 | 0 |
| 9 | 0 | 0 | 1 | 0 | 0 | 1 | 0 | 0 | 0 | 0 | 0 | 0 | 0 | 0 | 0 | 0 | 0 | 0 | 0 | 0 | 0 | 1 | 0 | 0 | 1 |
| 10 | 0 | 0 | 1 | 0 | 1 | 0 | 0 | 0 | 0 | 0 | 0 | 0 | 0 | 0 | 0 | 0 | 0 | 0 | 0 | 0 | 0 | 1 | 0 | 1 | 0 |
| 11 | 0 | 0 | 1 | 0 | 1 | 1 | 0 | 0 | 0 | 0 | 0 | 0 | 0 | 0 | 0 | 0 | 0 | 0 | 0 | 0 | 0 | 1 | 0 | 1 | 1 |
| 12 | 0 | 0 | 1 | 1 | 0 | 0 | 0 | 0 | 0 | 0 | 0 | 0 | 0 | 0 | 0 | 0 | 0 | 0 | 0 | 0 | 0 | 1 | 1 | 0 | 0 |
| 13 | 0 | 0 | 1 | 1 | 0 | 1 | 0 | 0 | 0 | 0 | 0 | 0 | 0 | 0 | 0 | 0 | 0 | 0 | 0 | 0 | 0 | 1 | 1 | 0 | 1 |
| 14 | 0 | 0 | 1 | 1 | 1 | 0 | 0 | 0 | 0 | 0 | 0 | 0 | 0 | 0 | 0 | 0 | 0 | 0 | 0 | 0 | 0 | 1 | 1 | 1 | 0 |
| 15 | 0 | 0 | 1 | 1 | 1 | 1 | 0 | 0 | 0 | 0 | 0 | 0 | 0 | 0 | 0 | 0 | 0 | 0 | 0 | 0 | 0 | 1 | 1 | 1 | 1 |

[FIG. 6]

| GRAY LEVEL | D5 | D4 | D3 | D2 | D1 | D0 | S44 | S43 | S42 | S41 | S3F | S34 | S33 | S32 | S31 | S2F | S24 | S23 | S22 | S21 | S1F | S14 | S13 | S12 | S11 |
|---|---|---|---|---|---|---|---|---|---|---|---|---|---|---|---|---|---|---|---|---|---|---|---|---|---|
| 16 | 0 | 1 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 |
| 17 | 0 | 1 | 0 | 0 | 0 | 1 | 0 | 0 | 0 | 0 | 0 | 0 | 0 | 0 | 0 | 0 | 0 | 0 | 0 | 1 | 1 | 1 | 1 | 1 | 1 |
| 18 | 0 | 1 | 0 | 0 | 1 | 0 | 0 | 0 | 0 | 0 | 0 | 0 | 0 | 0 | 0 | 0 | 0 | 0 | 1 | 0 | 1 | 1 | 1 | 1 | 1 |
| 19 | 0 | 1 | 0 | 0 | 1 | 1 | 0 | 0 | 0 | 0 | 0 | 0 | 0 | 0 | 0 | 0 | 0 | 0 | 1 | 1 | 1 | 1 | 1 | 1 | 1 |
| 20 | 0 | 1 | 0 | 1 | 0 | 0 | 0 | 0 | 0 | 0 | 0 | 0 | 0 | 0 | 0 | 0 | 0 | 1 | 0 | 0 | 1 | 1 | 1 | 1 | 1 |
| 21 | 0 | 1 | 0 | 1 | 0 | 1 | 0 | 0 | 0 | 0 | 0 | 0 | 0 | 0 | 0 | 0 | 0 | 1 | 0 | 1 | 1 | 1 | 1 | 1 | 1 |
| 22 | 0 | 1 | 0 | 1 | 1 | 0 | 0 | 0 | 0 | 0 | 0 | 0 | 0 | 0 | 0 | 0 | 0 | 1 | 1 | 0 | 1 | 1 | 1 | 1 | 1 |
| 23 | 0 | 1 | 0 | 1 | 1 | 1 | 0 | 0 | 0 | 0 | 0 | 0 | 0 | 0 | 0 | 0 | 0 | 1 | 1 | 1 | 1 | 1 | 1 | 1 | 1 |
| 24 | 0 | 1 | 1 | 0 | 0 | 0 | 0 | 0 | 0 | 0 | 0 | 0 | 0 | 0 | 0 | 0 | 1 | 0 | 0 | 0 | 1 | 1 | 1 | 1 | 1 |
| 25 | 0 | 1 | 1 | 0 | 0 | 1 | 0 | 0 | 0 | 0 | 0 | 0 | 0 | 0 | 0 | 0 | 1 | 0 | 0 | 1 | 1 | 1 | 1 | 1 | 1 |
| 26 | 0 | 1 | 1 | 0 | 1 | 0 | 0 | 0 | 0 | 0 | 0 | 0 | 0 | 0 | 0 | 0 | 1 | 0 | 1 | 0 | 1 | 1 | 1 | 1 | 1 |
| 27 | 0 | 1 | 1 | 0 | 1 | 1 | 0 | 0 | 0 | 0 | 0 | 0 | 0 | 0 | 0 | 0 | 1 | 0 | 1 | 1 | 1 | 1 | 1 | 1 | 1 |
| 28 | 0 | 1 | 1 | 1 | 0 | 0 | 0 | 0 | 0 | 0 | 0 | 0 | 0 | 0 | 0 | 0 | 1 | 1 | 0 | 0 | 1 | 1 | 1 | 1 | 1 |
| 29 | 0 | 1 | 1 | 1 | 0 | 1 | 0 | 0 | 0 | 0 | 0 | 0 | 0 | 0 | 0 | 0 | 1 | 1 | 0 | 1 | 1 | 1 | 1 | 1 | 1 |
| 30 | 0 | 1 | 1 | 1 | 1 | 0 | 0 | 0 | 0 | 0 | 0 | 0 | 0 | 0 | 0 | 0 | 1 | 1 | 1 | 0 | 1 | 1 | 1 | 1 | 1 |
| 31 | 0 | 1 | 1 | 1 | 1 | 1 | 0 | 0 | 0 | 0 | 0 | 0 | 0 | 0 | 0 | 0 | 1 | 1 | 1 | 1 | 1 | 1 | 1 | 1 | 1 |

[FIG. 7]

| GRAY LEVEL | D5 | D4 | D3 | D2 | D1 | D0 | S44 | S43 | S42 | S41 | S3F | S34 | S33 | S32 | S31 | S2F | S24 | S23 | S22 | S21 | S1F | S14 | S13 | S12 | S11 |
|---|---|---|---|---|---|---|---|---|---|---|---|---|---|---|---|---|---|---|---|---|---|---|---|---|---|
| 32 | 1 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 |
| 33 | 1 | 0 | 0 | 0 | 0 | 1 | 0 | 0 | 0 | 0 | 0 | 0 | 0 | 0 | 1 | 1 | 1 | 1 | 1 | 1 | 1 | 1 | 1 | 1 | 1 |
| 34 | 1 | 0 | 0 | 0 | 1 | 0 | 0 | 0 | 0 | 0 | 0 | 0 | 0 | 1 | 0 | 1 | 1 | 1 | 1 | 1 | 1 | 1 | 1 | 1 | 1 |
| 35 | 1 | 0 | 0 | 0 | 1 | 1 | 0 | 0 | 0 | 0 | 0 | 0 | 0 | 1 | 1 | 1 | 1 | 1 | 1 | 1 | 1 | 1 | 1 | 1 | 1 |
| 36 | 1 | 0 | 0 | 1 | 0 | 0 | 0 | 0 | 0 | 0 | 0 | 0 | 1 | 0 | 0 | 1 | 1 | 1 | 1 | 1 | 1 | 1 | 1 | 1 | 1 |
| 37 | 1 | 0 | 0 | 1 | 0 | 1 | 0 | 0 | 0 | 0 | 0 | 0 | 1 | 0 | 1 | 1 | 1 | 1 | 1 | 1 | 1 | 1 | 1 | 1 | 1 |
| 38 | 1 | 0 | 0 | 1 | 1 | 0 | 0 | 0 | 0 | 0 | 0 | 0 | 1 | 1 | 0 | 1 | 1 | 1 | 1 | 1 | 1 | 1 | 1 | 1 | 1 |
| 39 | 1 | 0 | 0 | 1 | 1 | 1 | 0 | 0 | 0 | 0 | 0 | 0 | 1 | 1 | 1 | 1 | 1 | 1 | 1 | 1 | 1 | 1 | 1 | 1 | 1 |
| 40 | 1 | 0 | 1 | 0 | 0 | 0 | 0 | 0 | 0 | 0 | 0 | 1 | 0 | 0 | 0 | 1 | 1 | 1 | 1 | 1 | 1 | 1 | 1 | 1 | 1 |
| 41 | 1 | 0 | 1 | 0 | 0 | 1 | 0 | 0 | 0 | 0 | 0 | 1 | 0 | 0 | 1 | 1 | 1 | 1 | 1 | 1 | 1 | 1 | 1 | 1 | 1 |
| 42 | 1 | 0 | 1 | 0 | 1 | 0 | 0 | 0 | 0 | 0 | 0 | 1 | 0 | 1 | 0 | 1 | 1 | 1 | 1 | 1 | 1 | 1 | 1 | 1 | 1 |
| 43 | 1 | 0 | 1 | 0 | 1 | 1 | 0 | 0 | 0 | 0 | 0 | 1 | 0 | 1 | 1 | 1 | 1 | 1 | 1 | 1 | 1 | 1 | 1 | 1 | 1 |
| 44 | 1 | 0 | 1 | 1 | 0 | 0 | 0 | 0 | 0 | 0 | 0 | 1 | 1 | 0 | 0 | 1 | 1 | 1 | 1 | 1 | 1 | 1 | 1 | 1 | 1 |
| 45 | 1 | 0 | 1 | 1 | 0 | 1 | 0 | 0 | 0 | 0 | 0 | 1 | 1 | 0 | 1 | 1 | 1 | 1 | 1 | 1 | 1 | 1 | 1 | 1 | 1 |
| 46 | 1 | 0 | 1 | 1 | 1 | 0 | 0 | 0 | 0 | 0 | 0 | 1 | 1 | 1 | 0 | 1 | 1 | 1 | 1 | 1 | 1 | 1 | 1 | 1 | 1 |
| 47 | 1 | 0 | 1 | 1 | 1 | 1 | 0 | 0 | 0 | 0 | 0 | 1 | 1 | 1 | 1 | 1 | 1 | 1 | 1 | 1 | 1 | 1 | 1 | 1 | 1 |

[FIG. 8]

| GRAY LEVEL | D5 | D4 | D3 | D2 | D1 | D0 | S44 | S43 | S42 | S41 | S3F | S34 | S33 | S32 | S31 | S2F | S24 | S23 | S22 | S21 | S1F | S14 | S13 | S12 | S11 |
|---|---|---|---|---|---|---|---|---|---|---|---|---|---|---|---|---|---|---|---|---|---|---|---|---|---|
| 48 | 1 | 1 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 |
| 49 | 1 | 1 | 0 | 0 | 0 | 1 | 0 | 0 | 0 | 1 | 1 | 1 | 1 | 1 | 1 | 1 | 1 | 1 | 1 | 1 | 1 | 1 | 1 | 1 | 1 |
| 50 | 1 | 1 | 0 | 0 | 1 | 0 | 0 | 0 | 1 | 0 | 1 | 1 | 1 | 1 | 1 | 1 | 1 | 1 | 1 | 1 | 1 | 1 | 1 | 1 | 1 |
| 51 | 1 | 1 | 0 | 0 | 1 | 1 | 0 | 0 | 1 | 1 | 1 | 1 | 1 | 1 | 1 | 1 | 1 | 1 | 1 | 1 | 1 | 1 | 1 | 1 | 1 |
| 52 | 1 | 1 | 0 | 1 | 0 | 0 | 0 | 1 | 0 | 0 | 1 | 1 | 1 | 1 | 1 | 1 | 1 | 1 | 1 | 1 | 1 | 1 | 1 | 1 | 1 |
| 53 | 1 | 1 | 0 | 1 | 0 | 1 | 0 | 1 | 0 | 1 | 1 | 1 | 1 | 1 | 1 | 1 | 1 | 1 | 1 | 1 | 1 | 1 | 1 | 1 | 1 |
| 54 | 1 | 1 | 0 | 1 | 1 | 0 | 0 | 1 | 1 | 0 | 1 | 1 | 1 | 1 | 1 | 1 | 1 | 1 | 1 | 1 | 1 | 1 | 1 | 1 | 1 |
| 55 | 1 | 1 | 0 | 1 | 1 | 1 | 0 | 1 | 1 | 1 | 1 | 1 | 1 | 1 | 1 | 1 | 1 | 1 | 1 | 1 | 1 | 1 | 1 | 1 | 1 |
| 56 | 1 | 1 | 1 | 0 | 0 | 0 | 1 | 0 | 0 | 0 | 1 | 1 | 1 | 1 | 1 | 1 | 1 | 1 | 1 | 1 | 1 | 1 | 1 | 1 | 1 |
| 57 | 1 | 1 | 1 | 0 | 0 | 1 | 1 | 0 | 0 | 1 | 1 | 1 | 1 | 1 | 1 | 1 | 1 | 1 | 1 | 1 | 1 | 1 | 1 | 1 | 1 |
| 58 | 1 | 1 | 1 | 0 | 1 | 0 | 1 | 0 | 1 | 0 | 1 | 1 | 1 | 1 | 1 | 1 | 1 | 1 | 1 | 1 | 1 | 1 | 1 | 1 | 1 |
| 59 | 1 | 1 | 1 | 0 | 1 | 1 | 1 | 0 | 1 | 1 | 1 | 1 | 1 | 1 | 1 | 1 | 1 | 1 | 1 | 1 | 1 | 1 | 1 | 1 | 1 |
| 60 | 1 | 1 | 1 | 1 | 0 | 0 | 1 | 1 | 0 | 0 | 1 | 1 | 1 | 1 | 1 | 1 | 1 | 1 | 1 | 1 | 1 | 1 | 1 | 1 | 1 |
| 61 | 1 | 1 | 1 | 1 | 0 | 1 | 1 | 1 | 0 | 1 | 1 | 1 | 1 | 1 | 1 | 1 | 1 | 1 | 1 | 1 | 1 | 1 | 1 | 1 | 1 |
| 62 | 1 | 1 | 1 | 1 | 1 | 0 | 1 | 1 | 1 | 0 | 1 | 1 | 1 | 1 | 1 | 1 | 1 | 1 | 1 | 1 | 1 | 1 | 1 | 1 | 1 |
| 63 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |

[FIG. 9]
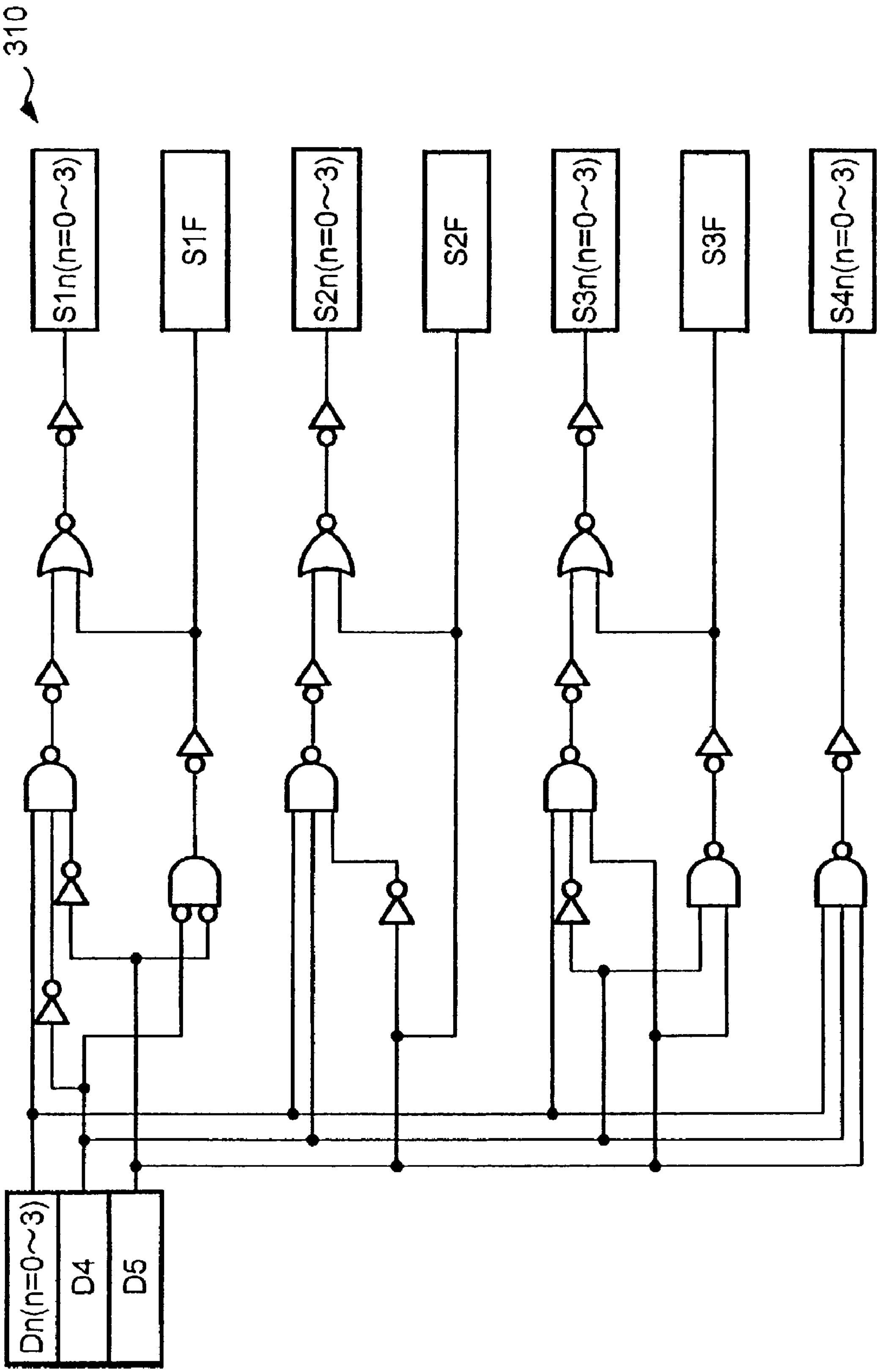

[FIG. 10]
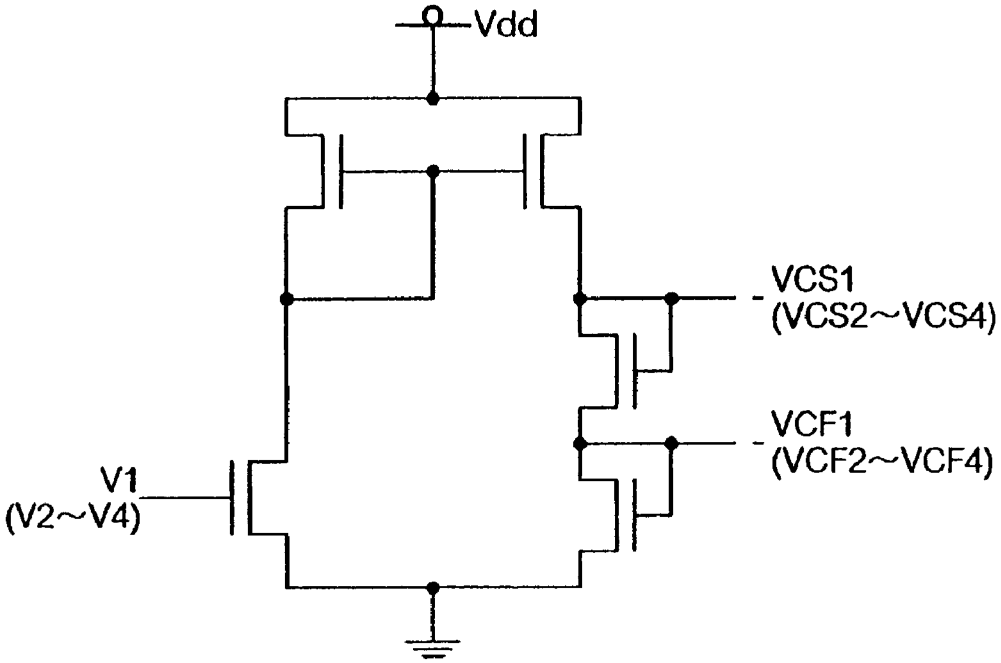

[FIG. 11]
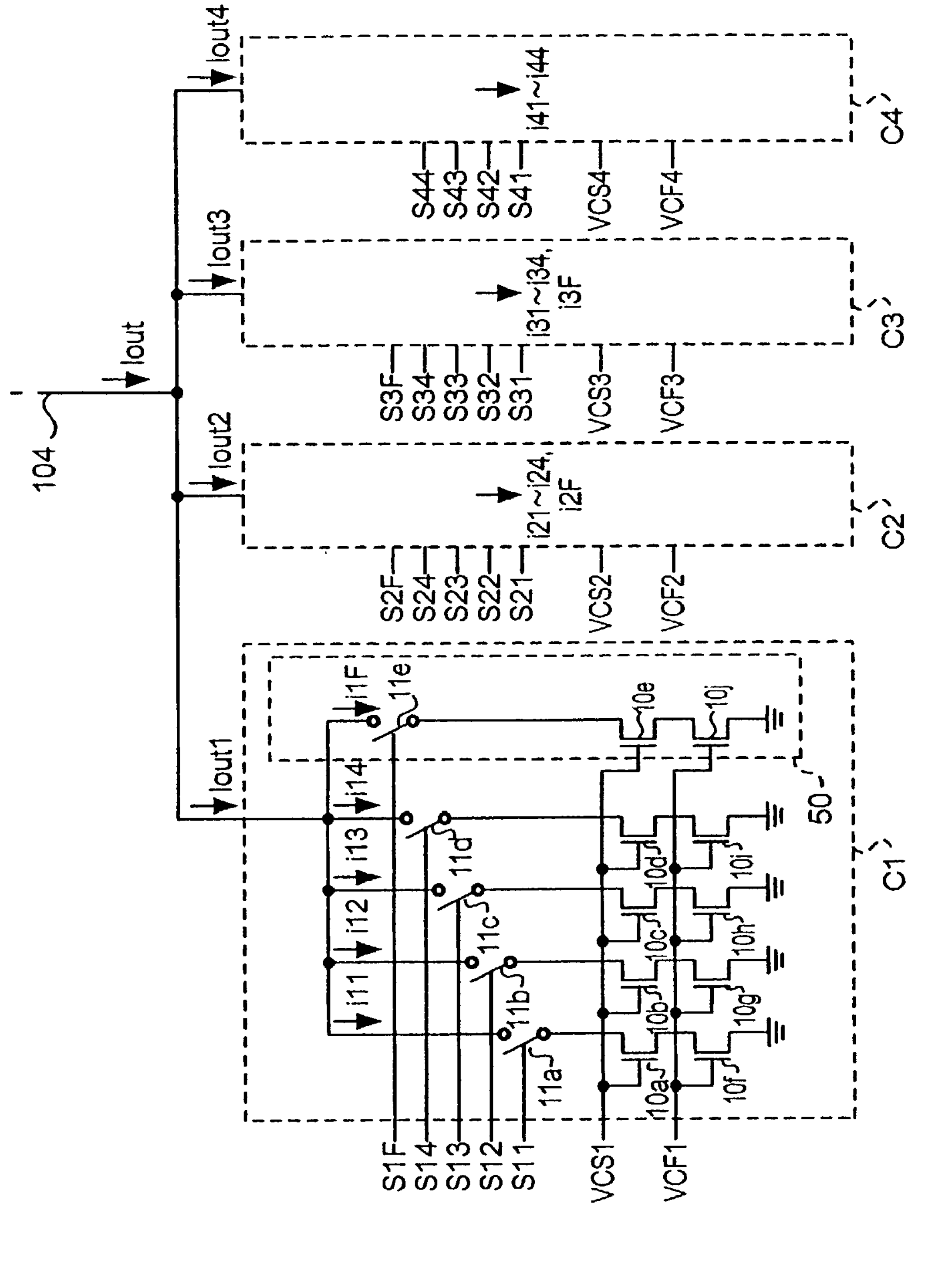

[FIG. 12]

| ELEMENTAL CURRENT | CURRENT VALUE |
|---|---|
| i11 | 1.5 |
| i12 | 3.0 |
| i13 | 6.0 |
| i14 | 12.0 |
| i1F | 1.5 |
| i21 | 4.75 |
| i22 | 9.5 |
| i23 | 19.0 |
| i24 | 38.0 |
| i2F | 4.75 |
| i31 | 24.13 |
| i32 | 48.25 |
| i33 | 96.5 |
| i34 | 193.0 |
| i3F | 24.13 |
| i41 | 61.68 |
| i42 | 123.4 |
| i43 | 246.7 |
| i44 | 493.4 |

[FIG. 13]

| GRAY LEVEL | MAIN CURRENT | GRAY LEVEL | MAIN CURRENT |
|---|---|---|---|
| 0 | 0 | 32 | 100.0 |
| 1 | 1.5 | 33 | 124.1 |
| 2 | 3.0 | 34 | 148.3 |
| 3 | 4.5 | 35 | 172.4 |
| 4 | 6.0 | 36 | 196.5 |
| 5 | 7.5 | 37 | 220.6 |
| 6 | 9.0 | 38 | 244.8 |
| 7 | 10.5 | 39 | 268.9 |
| 8 | 12.0 | 40 | 293.0 |
| 9 | 13.5 | 41 | 317.1 |
| 10 | 15.0 | 42 | 341.3 |
| 11 | 16.5 | 43 | 365.4 |
| 12 | 18.0 | 44 | 389.5 |
| 13 | 19.5 | 45 | 413.6 |
| 14 | 21.0 | 46 | 437.8 |
| 15 | 22.5 | 47 | 461.9 |
| 16 | 24.0 | 48 | 486.0 |
| 17 | 28.8 | 49 | 547.7 |
| 18 | 33.5 | 50 | 609.4 |
| 19 | 38.3 | 51 | 671.0 |
| 20 | 43.0 | 52 | 732.7 |
| 21 | 47.8 | 53 | 794.4 |
| 22 | 52.5 | 54 | 856.1 |
| 23 | 57.3 | 55 | 917.8 |
| 24 | 62.0 | 56 | 979.4 |
| 25 | 66.8 | 57 | 1041.1 |
| 26 | 71.5 | 58 | 1102.8 |
| 27 | 76.3 | 59 | 1164.5 |
| 28 | 81.0 | 60 | 1226.2 |
| 29 | 85.8 | 61 | 1287.8 |
| 30 | 90.5 | 62 | 1349.5 |
| 31 | 95.3 | 63 | 1411.2 |

[FIG. 14]
[FIG. 15]
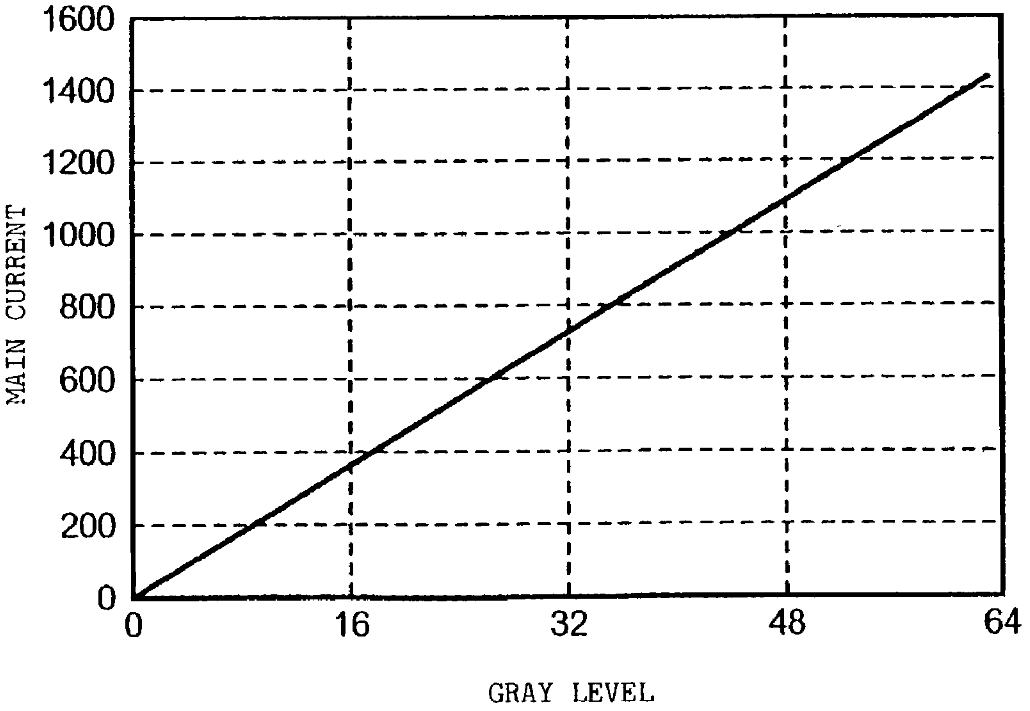

[FIG. 16]
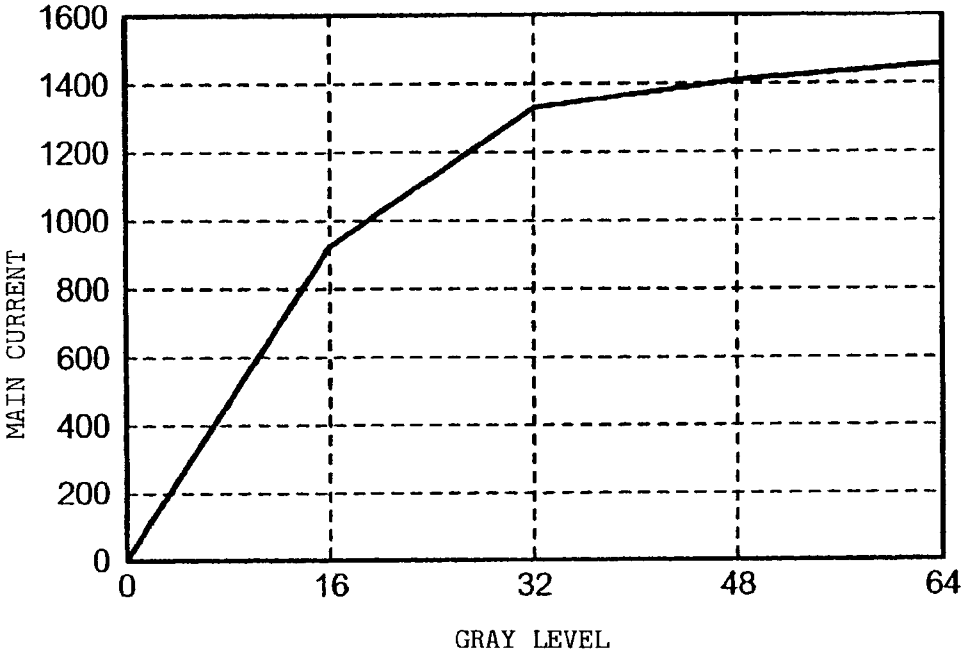
[FIG. 17]
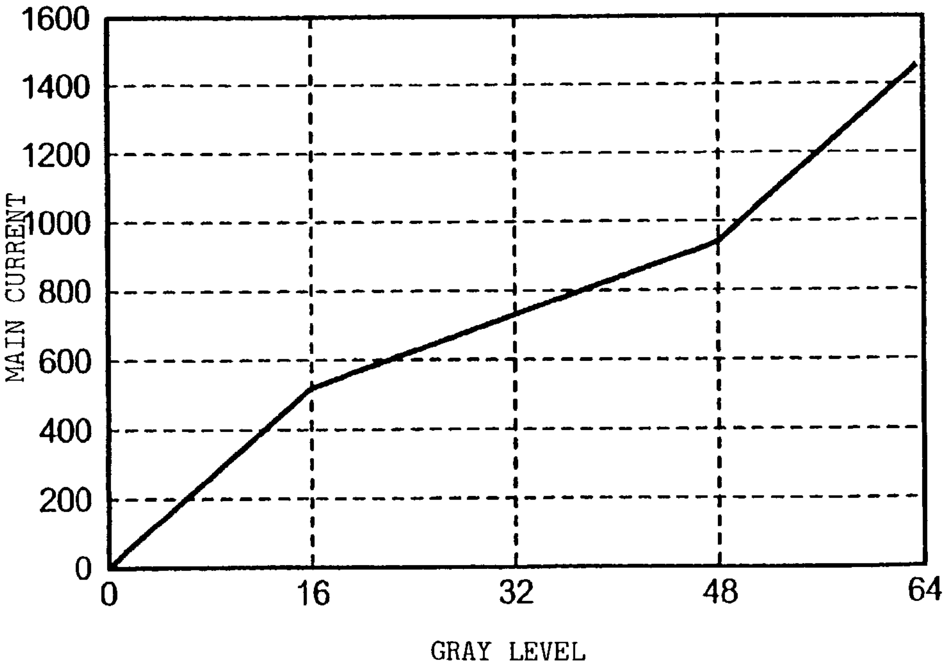

[FIG. 18]
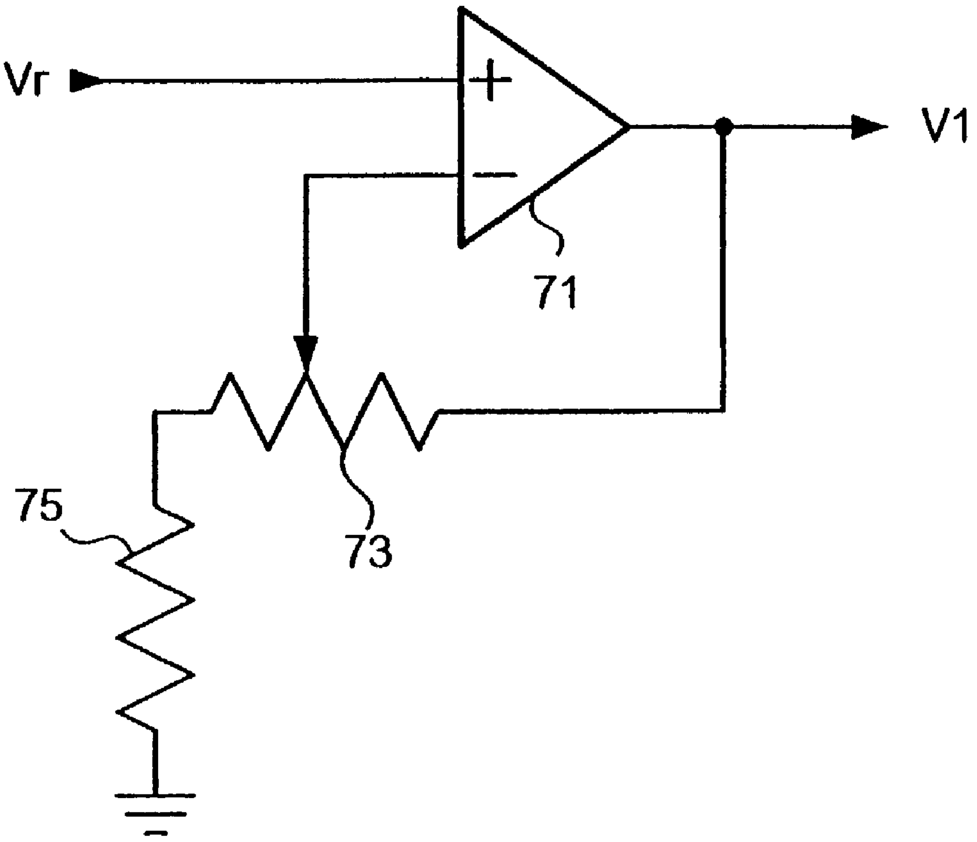

[FIG. 19]
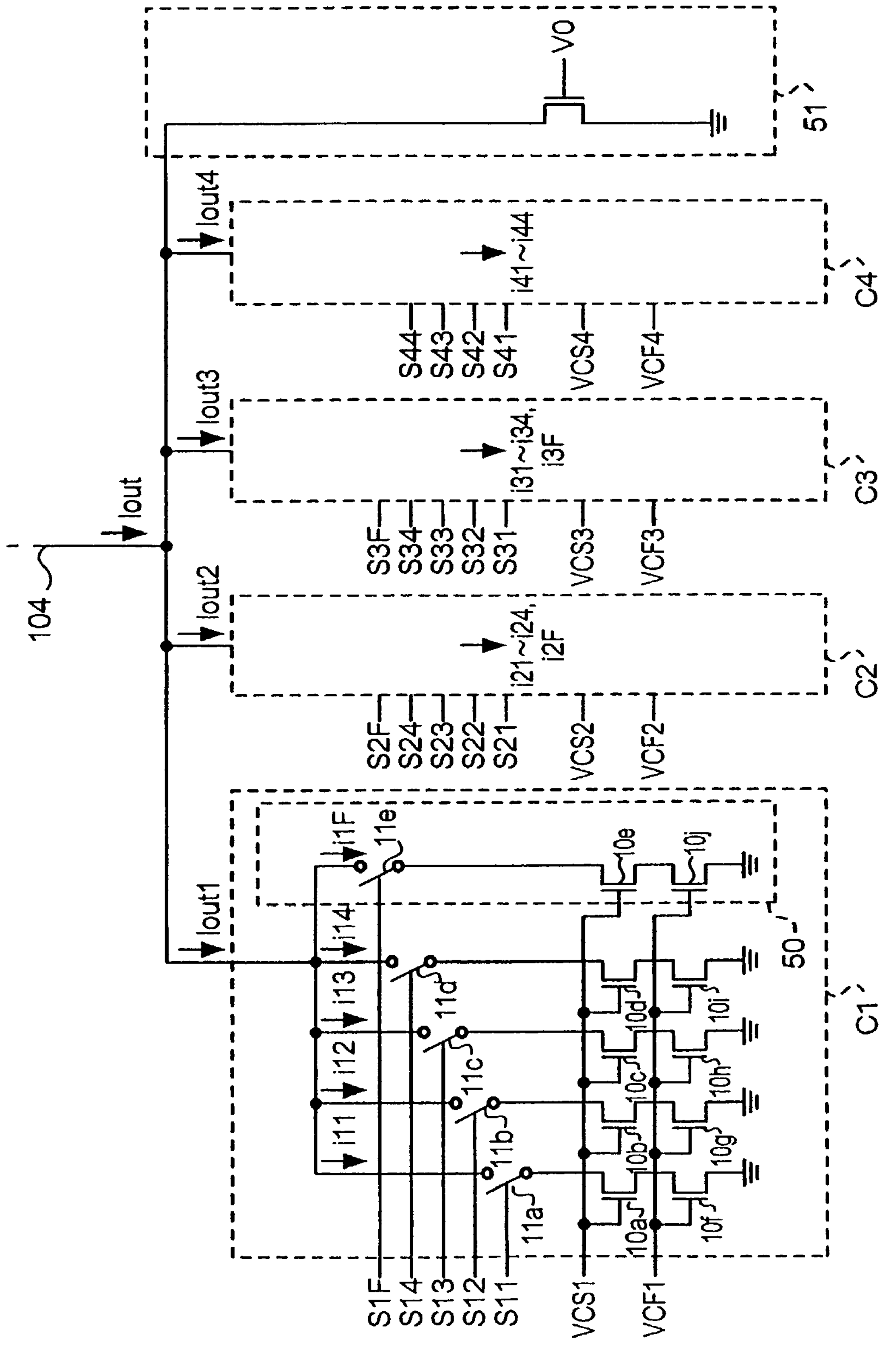

[FIG. 20]
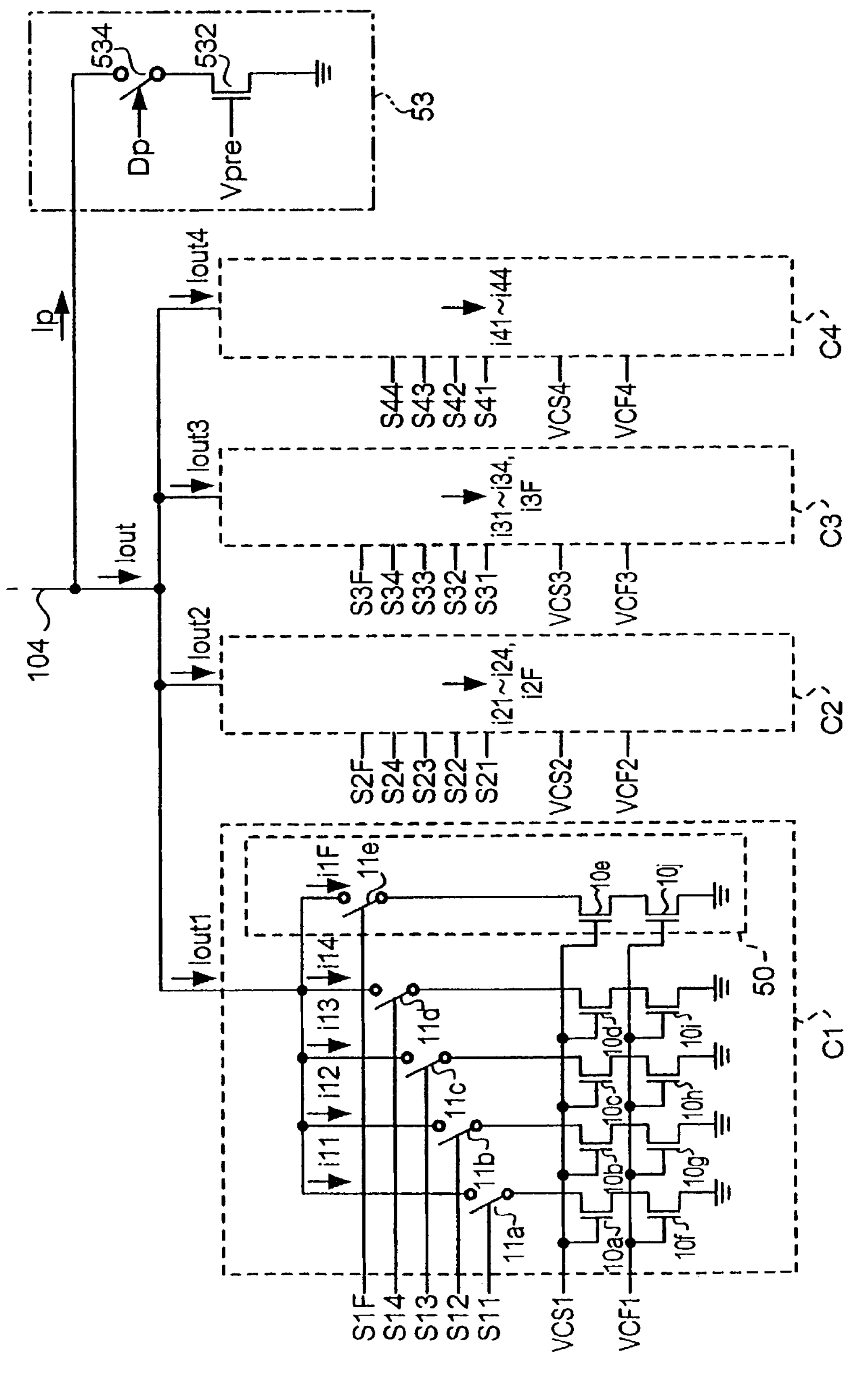

[FIG. 21]
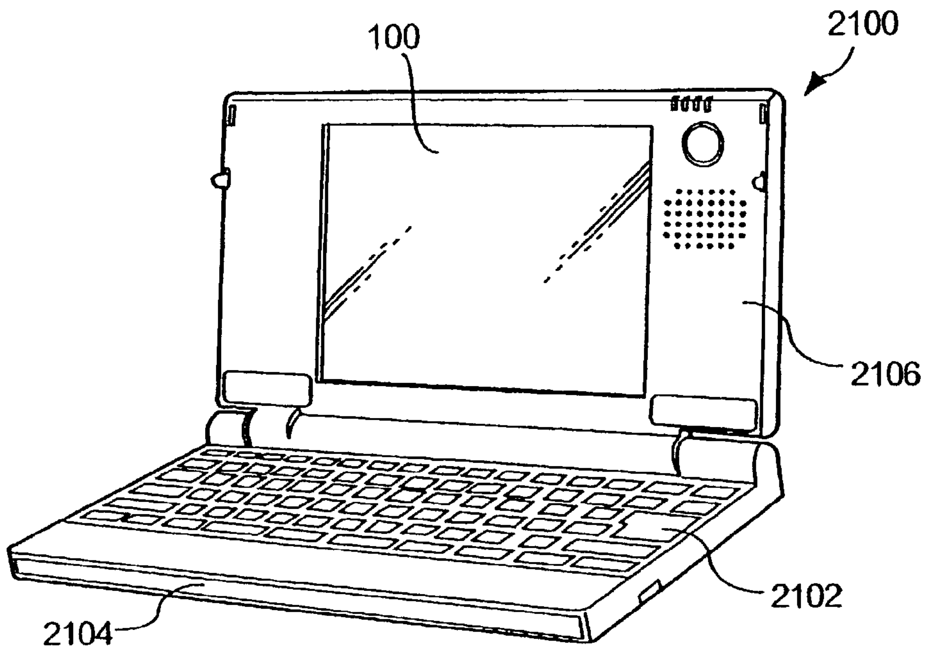
[FIG. 22]
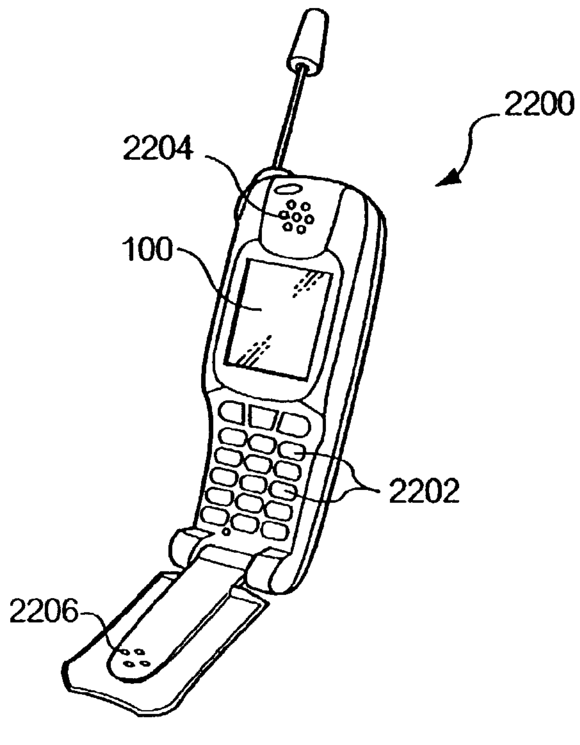

[FIG. 23]
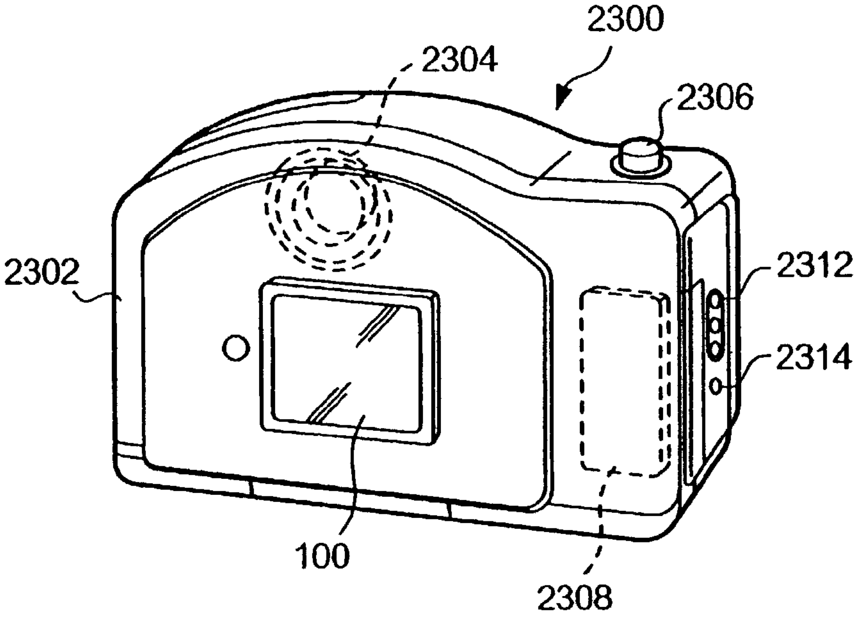
[FIG. 24]
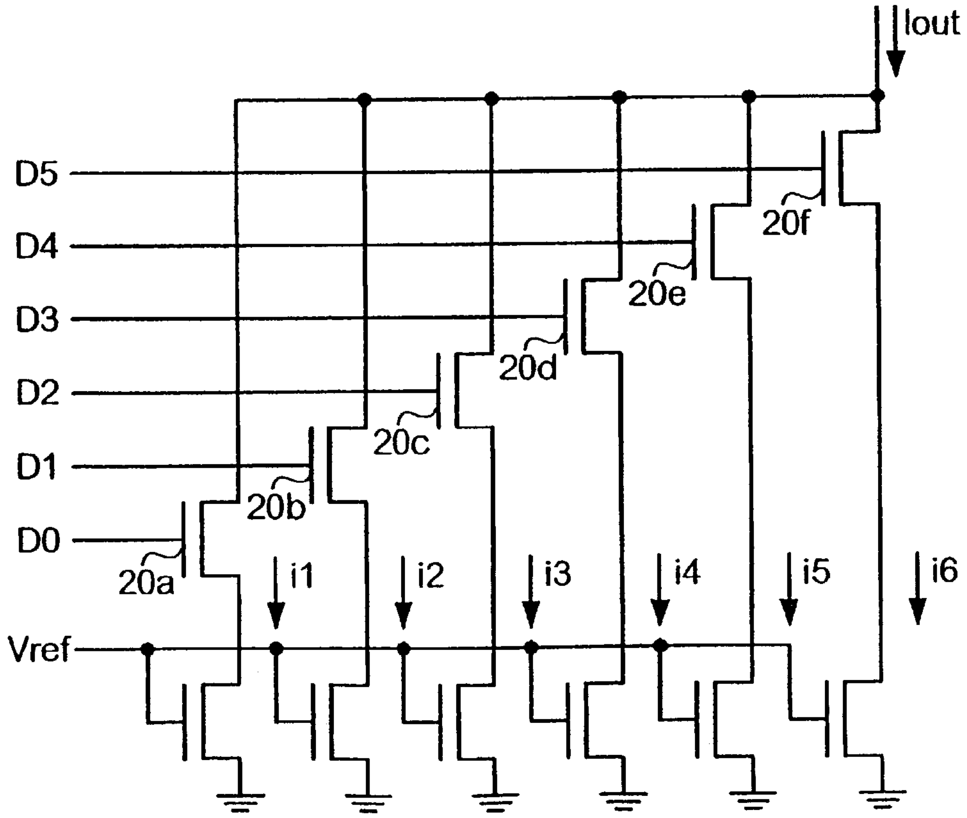

CURRENT GENERATING CIRCUIT, SEMICONDUCTOR INTEGRATED CIRCUIT, ELECTRO-OPTICAL DEVICE, AND ELECTRONIC APPARATUS

BACKGROUND OF THE INVENTION

1. Field of Invention

The present invention relates to current generating circuits for use in driving display panels, such as organic EL (Electronic Luminescence) panels. More specifically, the invention relates to a current generating circuit to generate current with non-linear characteristics with respect to digital data indicating the brightness of a display panel.

2. Description of Related Art

Generally, in liquid crystal panels, a change in gray level (brightness) of a pixel is not proportional to the voltage applied to the pixel. When driving liquid crystal panels, voltages with non-linear characteristics with respect to the linear gray scale of pixels (generally defined by digital data) are output. Thus, it would appear as if the gray scale changes linearly.

On the other hand, human visual characteristics are generally known as having logarithmic or exponential characteristics. If the brightness, represented as the gray level, changes linearly, it may not appear to the human eye that the gray level changes linearly. In view of these circumstances, an electro-optical device should have logarithmic or exponential gray scale characteristics, and hence it appears to the human eye that the gray scale has linear characteristics. A series of these processes may be referred to as "γ" correction.

Recently, organic EL panels have been attracting interest as next-generation display panels. This is because, unlike liquid crystal elements for simply changing the light transmission, organic EL elements used as electro-optical elements in organic EL panels are self-luminous elements which emit light by themselves. For this reason, organic EL panels have excellent characteristics, such as a wider viewing angle, a higher contrast, and a higher response speed than liquid crystal panels.

Unlike voltage-driven liquid crystal elements, organic EL elements are so-called current-driven elements. When driving organic EL elements, it is necessary to generate current, not voltage, in accordance with the gray level of a pixel. FIG. 24 shows a related art current generating circuit that generates current.

In FIG. 24, a voltage generating circuit is a current-adding-type D/A converter, which switches on/off transistors 20*a* to 20*f* in accordance with 6-bit digital data (D0 to D5) indicating the gray level of a pixel to select elemental currents i1 to i6 and which combines the selected elemental currents to obtain a current Iout in accordance with the gray level.

SUMMARY OF THE INVENTION

In organic EL elements, as in liquid crystals, it is necessary to perform γ correction in order to generate logarithmic or exponential gray scale characteristics. In the current generating circuit shown in FIG. 24, the output current generated relative to 6-bit digital data indicating the gray level of a pixel has linear characteristics. If the current generating circuit remains unchanged, it is impossible to perform sufficient γ correction.

In order to generate a current with non-linear characteristics using such a current generating circuit, for example, it is necessary to have a scheme to prepare in advance a plurality of voltage sources and to individually control gate currents of the transistors 20*a* to 20*f* In this scheme, as the number of gray levels increases, so does the number of necessary voltage sources. Thus, the circuit configuration becomes complex.

In general, as the number of voltage sources increases, the power consumed by generating voltage increases. This scheme is thus unsuitable for use in organic EL panels of electronic apparatuses, such as mobile personal computers and cellular phones, for example, for which there are strong demands to reduce the power consumption.

The present invention addresses the foregoing circumstances and provides a current generating circuit with a simple circuit configuration and low power consumption.

In order to address or achieve the foregoing circumstances, according to an aspect of the present invention, a current generating circuit is provided that includes a plurality of circuit blocks to output sub-currents by selecting elemental currents from among a plurality of elemental currents in accordance with input digital data; and a combining circuit to output a main current by combining the sub-currents.

Preferably, each of the circuit blocks generates the plurality of elemental currents by transistors having different gain coefficients.

Preferably, the transistors include a combination of transistors in which the ratios of the gain coefficients are the binary weights.

Preferably, the transistors are field effect transistors, and a common reference voltage is supplied to gate electrodes of the transistors of each of the circuit blocks.

Similarly, in order to address or achieve the foregoing circumstances, according to another aspect of the present invention, a current generating circuit is provided that includes a plurality of circuit blocks to generate sub-currents; and a combining circuit to output a main current by combining the sub-currents generated by the circuit blocks. Each of the circuit blocks is allocated to a corresponding range obtained by dividing a possible range of input digital data. When the digital data value is below the range allocated to each of the circuit blocks, the circuit block generates an approximately zero sub-current. When the digital data value is within the range allocated to each of the circuit blocks, the circuit block generates a sub-current having an approximately linear characteristic in accordance with the digital data. When the digital data value is above the range allocated to each of the circuit blocks, the circuit block generates a sub-current corresponding to the minimum value of the range of digital data allocated to an upper block adjacent to the circuit block.

Preferably, the approximately linear characteristic of the circuit block can be set individually for each of the circuit blocks.

Preferably, the current generating circuit further includes an offset current path for defining the value of a lower limit for the main current.

An electro-optical device includes a plurality of scanning lines; a plurality of data lines; a scanning line driving circuit to drive the scanning lines; a data line driving circuit to drive the data lines; and electro-optical elements located at intersections of the scanning lines and the data lines. The data line driving circuit includes the above-described current generating circuit and supplies a main current generated by the current generating circuit to each of the data lines.

In the electro-optical device, preferably, the electro-optical elements are driven elements driven by current.

The driven elements may be organic electro-luminescence elements.

Preferably, the electro-optical device further includes a memory to store data to define brightness gray levels of the organic electro-luminescence elements; and a control circuit to read the data from the memory and supply the data as the digital data to the data line driving circuit.

Preferably, the electro-optical device further includes an oscillator circuit to supply a reference operation signal functioning as an operation reference.

According to another aspect of the present invention, an electronic apparatus has the above-described electro-optical device mounted thereon.

BRIEF DESCRIPTION OF THE DRAWINGS

FIG. 1 is a schematic showing the configuration of an electro-optical device according to an embodiment of the present invention;

FIG. 2 is a schematic showing the configuration of a pixel circuit in the electro-optical device;

FIG. 3 is a timing chart for describing the operation of the pixel circuit;

FIG. 4 is a schematic showing the configuration of a current generating circuit included in a data line driving circuit of the electro-optical device;

FIG. 5 is a chart showing the contents of conversion performed by a converter circuit of the current generating circuit;

FIG. 6 is a chart showing the contents of conversion performed by the converter circuit of the current generating circuit;

FIG. 7 is a chart showing the contents of conversion performed by the converter circuit of the current generating circuit;

FIG. 8 is a chart showing the contents of conversion performed by the converter circuit of the current generating circuit;

FIG. 9 is a schematic showing an example of the converter circuit;

FIG. 10 is a schematic showing a reference voltage generating circuit of the current generating circuit;

FIG. 11 is a schematic showing the configuration of a current selecting circuit of the current generating circuit;

FIG. 12 is a chart of examples of elemental currents generated by the current generating circuit;

FIG. 13 is a chart of examples of main currents generated by the current generating circuit;

FIG. 14 is a graph of a gray level/main current characteristic of the current generating circuit;

FIG. 15 is a graph of the gray level/main current characteristic of the current generating circuit;

FIG. 16 is a graph of the gray level/main current characteristic of the current generating circuit;

FIG. 17 is a graph of the gray level/main current characteristic of the current generating circuit;

FIG. 18 is a schematic showing an example of a portion of a power supply circuit for generating a voltage V1;

FIG. 19 is a schematic showing an application of the current generating circuit;

FIG. 20 is a schematic showing an application of the current generating circuit;

FIG. 21 is a perspective view showing the configuration of a mobile personal computer to which the electro-optical device is applied;

FIG. 22 is a perspective view showing the configuration of a cellular phone to which the electro-optical device is applied;

FIG. 23 is a perspective view showing the configuration of a digital still camera to which the electro-optical device is applied;

FIG. 24 is a schematic showing the configuration of a known current generating circuit.

DETAILED DESCRIPTION OF PREFERRED EMBODIMENTS

With reference to the drawings, embodiments of the present invention will now be described.

FIG. 1 is a schematic showing the schematic configuration of an electro-optical device according to an embodiment of the present invention.

As shown in FIG. 1, an electro-optical device 100 of this embodiment includes a display panel 1. The display panel 1 has plural m scanning lines 102, plural n data lines 104, the scanning lines 102 and the data lines 104 being orthogonal to each other (while electrically insulated), and pixel circuits 110 at intersections of the scanning lines 102 and the data lines 104. The electro-optical device 100 also includes a scanning line driving circuit 2 to drive the m scanning lines 102, a data line driving circuit 3 to drive the n data lines 104, a memory 4 to store digital data Dpix to define the brightness or gray level of each pixel of an image to be displayed, a control circuit 5 to control the components, an oscillator circuit 6 to generate a reference signal and a control signal to operate the components in synchronization, and a power supply circuit 7 to supply power to the components.

Of these components, the digital data Dpix stored in the memory 4 is supplied from an external apparatus, such as a computer, and defines the brightness of an organic EL element stored in each pixel circuit 110. In this embodiment, in order to simplify the description, the digital data Dpix has 6 bits and represents 64 gray levels (the sixth power of 2) ranging from "0" to "63" per pixel.

In contrast, the scanning line driving circuit 2 generates scanning signals Y1, Y2, Y3, . . . , Ym to sequentially select the scanning lines 102 one at a time. Specifically, as shown in FIG. 3, the scanning line driving circuit 2 supplies a pulse with a width corresponding to one horizontal scanning period (1H) at the beginning of a vertical scanning period (1F) as the scanning signal Y1 to the first scanning line 102. From this point onward, the pulse is sequentially shifted and supplied as the scanning signals Y2, Y3, . . . , Ym to the second, third, . . . , m-th scanning lines 102. In general, when a scanning signal Yi supplied to an i-th (i is an integer satisfying $1 \leqq i \leqq m$) scanning line 102 becomes the H level, it means that the scanning line 102 is selected.

In addition to the scanning signals Y1, Y2, Y3, . . . , Ym, the scanning line driving circuit 2 generates luminous control signals Vg1, Vg2, Vg3, . . . , Vgm by inverting the logical level of the scanning signals Y1, Y2, Y3, . . . , Ym, and supplies the luminous control signals Vg1, Vg2, Vg3, . . . , Vgm to the display panel 1. This is not shown in FIG. 1.

The data line driving circuit 3 has a current generating circuit, which is a feature of the present invention, for each data line 104. The data line driving circuit 3 supplies current indicating the gray level or brightness to the pixel circuits 110 located on the selected scanning line 102 via the data lines 104. Specifically, the data line driving circuit 3 generates, for example, current in accordance with digital data read from the memory 4 and supplies the current to the pixel circuits 110 located on the selected scanning line 102 via the data lines 104. The details of the current generating circuit will be described hereinafter.

The control circuit 5 controls selection of the scanning line 102 by the scanning line driving circuit 2. Also, the control circuit 5 reads digital data from the memory 4 in synchronization with the selection and supplies the digital data to the data line driving circuit 3. Therefore, currents in accordance with brightness levels of organic EL elements of the pixel circuits 110 located on the selected scanning line 102 are supplied to the pixel circuits 110 via the data lines 104.

The components 1 to 7 of the electro-optical device 100 can be manufactured in various forms. For example, the components 1 to 7 can be formed independently, or some or all of the components 1 to 7 can be integrated (for example, the scanning line driving circuit 2 and the data line driving circuit 3 can be integrated, or some or all of the components except for the display panel 1 can be formed by a programmable IC chip and the functions of these components can be realized by software using a program written to the IC chip).

The pixel circuits 110 of the electro-optical device 100 are described below. FIG. 2 is a schematic circuit diagram showing the configuration of one of the pixel circuits 110. All the pixel circuits 110 have the same configuration. In order to generalize and simplify the description of scanning signals, the pixel circuit 110 located at the intersection of the i-th scanning line 102 and one data line 104 is described below.

As shown in FIG. 2, the pixel circuit 110 located at the intersection of the scanning line 102 and the data line 104 has four thin film transistors (hereinafter "TFT") 1102, 1104, 1106, and 1108, a capacitive element 1120, and an organic EL element 1130.

Of these components, the source electrode of the p-channel TFT 1102 is connected to a power supply line 109 to which a high potential Vdd of the power supply is applied, and the drain electrode is connected to the drain electrode of the n-channel TFT 1104, the drain electrode of the n-channel TFT 1106, and the source electrode of the n-channel TFT 1108.

A first end of the capacitive element 1120 is connected to the power supply line 109, and a second end is connected to the gate electrode of the TFT 1102 and the drain electrode of the TFT 1108. The gate electrode of the TFT 1104 is connected to the scanning line 102, and the source electrode is connected to the data line 104. The gate electrode of the TFT 1108 is connected to the scanning line 102.

In contrast, the gate electrode of the TFT 1106 is connected to a luminous control line 108, and the source electrode is connected to the anode of the organic EL element 1130. Concerning the luminous control line 108, a luminous control signal Vgi is supplied by the scanning line driving circuit 2. Concerning the organic EL element 1130, an organic EL layer is held between the anode and the cathode, and light with brightness provided in accordance with forward current is emitted. The cathode of the organic EL element 1130 is a common electrode of all the pixel circuits 110 and is at a low (reference) potential of the power supply.

In this arrangement, when a scanning signal Yi supplied to the scanning line 102 becomes the H level, the n-channel TFT 1108 conducts (on) the source electrode and the drain electrode. The TFT 1102, in which the gate electrode and the drain electrode are connected to each other, functions as a diode. When the scanning signal Yi supplied to the scanning line 102 becomes the H level, the n-channel TFT 1104 is also turned on, like the TFT 1108. Consequently, the current lout generated by the current generating circuit 30 flows from the power supply line 109→TFT 1102→TFT 1104→data line 104. At the same time, charge in accordance with the potential of the gate electrode of the TFT 1102 is accumulated in the capacitive element 1120.

When the scanning signal Yi becomes the L level, the TFTs 1104 and 1108 are turned off, while the charge accumulated in the capacitive element 1102 remains unchanged. Thus, the gate electrode of the TFT 1102 is maintained at the voltage when the current Iout flowed.

When the scanning signal Yi becomes the L level, the luminous control signal Vgi becomes the H level. Thus, the n-channel TFT 1106 is turned on, and a current in accordance with the gate voltage flows between the source and the drain of the TFT 1102. Specifically, the current flows from the power supply line 109→TFT 1102→TFT 1106→organic EL element 1130. Thus, the organic EL element 1130 emits light in accordance with the current value.

The current value of the current flowing through the organic EL element 1130 is determined by the voltage of the gate electrode of the TFT 1102. The voltage of the gate electrode is the voltage maintained by the capacitive element 1102 when the current lout flows through the data line 104 in response to the H-level scanning signal. Thus, when the luminous control signal Vgi becomes the H level, the current flowing through the organic EL element 1130 agrees with the current lout that flowed immediately before.

If the TFTs 1102 of all the pixel circuits 110 have different characteristics, it is possible to supply the same current to the organic EL elements 1130 included in the pixel circuits 110. It is thus possible to suppress display nonuniformity caused by the differences.

Although one pixel circuit 110 has been described, since m pixel circuits 110 share the i-th scanning line 102, the m pixel circuits 110 operate in a similar manner when the scanning signal Yi becomes the H level.

As shown in FIG. 3, the scanning signals Y1, Y2, Y3, . . . , Ym exclusively become the H level one after another. In all the pixel circuits 110, the gate electrodes of the TFTs 1102 are maintained by the capacitive elements 1120 at the voltages when the current lout flowed in accordance with the brightness levels of the organic EL elements 1130.

The transistors 1102, 1104, 1106, and 1108 do not need to be of the channel types described above. For each of the transistors 1102, 1104, 1106, and 1108, p or n channel can be can appropriately selected.

The current generating circuit, which is an aspect of the present invention, will now be described. FIG. 4 is a schematic showing the configuration of one line of a current generating circuit 30 included in the data line driving circuit 3.

In FIG. 4, a converter circuit 310 converts 6-bit digital data (D5 to D0) read from the memory 4 (see FIG. 1) into 19-bit digital data. The 19-bit digital data can be divided into four groups. Specifically, a first group has 5 bits S11 to S14 and S1F; a second group has 5 bits S21 to S24 and S2F; a third group has 5 bits S31 to S34 and S3F; and a fourth group has 4 bits S41 to S44. The first group is supplied to a circuit block C1; the second group is supplied to a circuit block C2; the third group is supplied to a circuit block C3; and the fourth group is supplied to a circuit block C4.

The details of conversion by the converter circuit 310 are described below. The gray level range of a decimal value (D5 is the most significant bit) indicated by the 6-bit digital data (D0 to D5) has 64 steps from "0" to "63". When the gray level of the decimal value is "0" to "15", the converter circuit 310 converts the 6-bit digital data into 19-bit digital data, such as that shown in FIG. 5, and outputs the 19-bit digital data. More specifically, as the gray level advances from "0" to "15", the decimal value indicated by the bits S11 to S14 (S14 is the most significant bit) advances from "0" to "15" in a similar manner. All the other bits are converted so that they represent binary "0".

When the gray level of the decimal value is "16" to "31", the converter circuit 310 converts the 6-bit digital data into 19-bit digital data, such as that shown in FIG. 6, and outputs the 19-bit digital data. More specifically, as the gray level advances from "16" to "31", the decimal value indicated by the bits S21 to S24 (S24 is the most significant bit) advances from "0" to "15". The bits S11 to S14 and S1F are converted to be binary "1", and all the other bits are converted to be binary "0".

When the gray level of the decimal value is "32" to "47", the converter circuit 310 converts the 6-bit digital data into 19-bit digital data, such as that shown in FIG. 7, and outputs the 19-bit digital data. More specifically, as the gray level advances from "32" to "47", the decimal value indicated by the bits S31 to S34 advances from "0" to "15". The bits S14 to S11, S1F, S24 to S21, and S2F are converted to be binary "1", and all the other bits are converted to be binary "0".

When the gray level of the decimal value is "48" to "63", the converter circuit 310 converts the 6-bit digital data into 19-bit digital data, such as that shown in FIG. 8, and outputs the 19-bit digital data. More specifically, as the gray level advances from "48" to "63", the decimal value indicated by the bits S41 to S44 (S44 is the most significant bit) advances from "0" to "15". The bits S11 to S14, S1F, S21 to S24, S2F, S31 to S34, and S3F are all converted to be binary "1".

FIG. 9 shows an example of the converter circuit 310 implemented by a logical circuit. Needless to say, the converter circuit 310 can be implemented not by a logical circuit but by a table having stored therein the details of conversion.

Referring again to FIG. 4, a reference voltage generating circuit 320 generates reference voltages VCS1 to VCS4 and VCF1 to VCF4 from voltages V1 to V4 generated by the power supply circuit 7.

The reference voltage generating circuit 320 generates, for example, the reference voltages VCS1 and VCF1 from the voltage V1 by a current mirror circuit, such as that shown in FIG. 10. In FIG. 10, the voltage V1 output from the power supply circuit 7 shown in FIG. 1 is supplied to the input side of the current mirror circuit, while the reference voltages VCS1 and VCF1 are removed from the output side. Similar current mirror circuits generate the reference voltages VCS2 and VCF2 from the voltage V2, the reference voltages VCS3 and VCF3 from the voltage V3, and the reference voltage VCF4 from the voltage V4, respectively.

The circuit block C1 is allocated to "0" to "15" of the decimal-value gray levels "0" to "63" indicated by the 6-bit digital data (D0 to D5). More specifically, as shown in FIG. 11, switches 11*a* to 11*d* and 11*e* are turned on/off in accordance with the bits S11 to S14 and S1F of the 19-bit data generated by conversion by the converter circuit 310, and elemental currents i11 to i14 and i1F output by FETs (Field-Effect Transistor) 10*a* to 10*e* and 10*f* to 10*j* are combined to generate a sub-current Iout1.

When a predetermined voltage is supplied to the gate electrode and the source electrode of an FET, the current flowing through the FET defines a gain coefficient β. The FETs 10*f* to 10*j* are set to have ratios of gain coefficients β of 10*f*: 10*g*: 10*h*: 10*i*: 10*j*=1:2:4:8:1.

The reference voltage VCS1 is commonly supplied to the gate electrodes of the FETs 10*a* to 10*e*, and the reference voltage VCF1 is commonly supplied to the gate electrodes of the FETs 10*f* to 10*j*. Accordingly, the ratios of elemental currents i1 to i4 and i1F are i1:i2:i3:i4:i1F=1:2:4:8:1.

In the circuit block C1, the FET configuration is such that the FETs are grouped into two stages, namely, the FETs 10*a* to 10*e* and the FETs 10*f* to 10*j*, in order to have stable characteristics of the output current Iout.

Theoretically, it is possible to form a circuit having an equivalent function by only using the FETs 10*f* to 10*j*.

The circuit block C2 is allocated to "16" to "31" of the decimal-value gray levels "0" to "63" indicated by the digital data (D0 to D5). The circuit block C2 is equivalent to the circuit block C1. In other words, the circuit block C2 appropriately selects elemental currents i21 to i24 and i2F in accordance with the bits S21 to S24 and S2F of the 19-bit data, which is generated by conversion by the converter circuit 310, and combines the selected elemental currents to generate a sub-current Iout2.

The circuit block C3 is allocated to "32" to "47" of the decimal-value gray levels "0" to "63" indicated by the digital data (D0 to D5). The circuit block C3 is equivalent to the circuit blocks C1 and C2. In other words, the circuit block C3 appropriately selects elemental currents i31 to i34 and i3F in accordance with the bits S31 to S34 and S3F of the 19-bit data, which is generated by conversion by the converter circuit 31, and combines the selected elemental currents to generate a sub-current Iout3.

The circuit block C4 is allocated to "48" to "63" of the decimal-value gray levels "0" to "63" indicated by the digital data (D0 to D5). The circuit block C4 is equivalent to the circuit block C1 except for the fact that the circuit block C4 does not have parts corresponding to the switch 11*f* and the FETs 10*e* and 10*j* (enclosed by a dotted line 50). The circuit block C4 appropriately selects elemental currents i41 to i44 in accordance with the bits S41 to S44 and combines the selected elemental currents to generate a sub-current Iout4.

The circuit enclosed by the dotted line 50 in the circuit block C1 is provided to select the elemental current i1F. The elemental current i1F is used to add the elemental currents i11 to i14 when generating the sub-current Iout1 corresponding to the decimal-value gray level "16" (the minimum value of a range allocated to the circuit block adjacent to the top side of the circuit block C1) indicated by the digital data (D5 to D0).

Similarly, the circuits enclosed by the dotted lines 50 in the circuit blocks C2 and C3 are provided to select the elemental currents i2F and i3F. The elemental current i2F is used to add the elemental currents i21 to i24 when generating the sub-current Iout2 corresponding to the gray level "32". The elemental current i3F is used to add the elemental currents i31 to i34 when generating the sub-current Iout3 corresponding to the gray level "48".

Since the gray level "64" does not exist in this embodiment, a sub-current Iout4 that is greater than or equal to the sum of the elemental currents i21 to i24 is unnecessary. Thus, the current block C4 does not have a circuit corresponding to the dotted line 50.

The sub-currents Iout1 to Iout4 generated by the circuit blocks C1 to C4 are combined by a combining current line 32 to generate a main current lout, and the main current lout is output to the corresponding data line 104.

The manner in which the value of the main current lout is controlled relative to the 6-bit digital data (D0 to D5) is described below.

When the digital data (D0 to D5) is within the range of gray levels from “0” to “15”, as shown in FIG. 5, the bits S11 to S14 are converted so that a decimal value represented by these 4 bits (S14 is the most significant bit) sequentially advances from “0” to “15”. The switches 11*a* to 11*d* in the circuit block C1 are turned on/off, and the elemental currents i11 to i14 are appropriately selected. Thus, the sub-current Iout1 is generated.

When the gray level is from “0” to “15”, the bits other than the bits S11 to S14 are converted to be binary “0”. All the switches in the circuit blocks C2, C3, and C4 are turned off. As a result, the sub-currents Iout2, Iout3, and Iout4 are all zero.

The main current lout when the gray level is within the range from “0” to “15” can be represented only by the sub-current Iout1, which is generated by combining, by the circuit block C1, the appropriately selected elemental currents i11 to i14.

When the digital data (D0 to D5) is within the range of gray levels from “16” to “31”, as shown in FIG. 6, the bits S11 to S14 and S1F are converted to be binary “1”. Thus, all the switches 11*a* to 11*d* and 11*e* in the circuit block C1 are turned on. As a result, the sub-current Iout1 becomes the maximum value indicated by the sum of the elemental currents i11 to i14 and i1F.

When the gray level is from “16” to “31”, the bits S21 to S24 are converted so that a decimal value represented by the four bits (S24 is the most significant bit) sequentially advances from “0” to “15”. Thus, the elemental currents i21 to i24 are appropriately selected by the circuit block C2, and hence the sub-current Iout2 is generated.

When the gray scale is within “16” to “31”, the bits S31 to S34, S3F, and S41 to S44 are converted to be “0”. The sub-current Iout3 by the circuit block C3 and the sub-current Iout4 by the circuit block C4 are both zero.

The main current lout when the gray level is within the range from “16” to “31” is obtained by adding the sub-current Iout2, which is generated by combining the appropriately selected elemental currents i21 to i24 by the circuit block C2, to the sub-current Iout1 having the maximum value. When the gray level is “16” (the minimum value of the range allocated to the circuit block C2), more specifically, the current value Iout2 is zero. Thus, the main current lout can be indicated by the current value Iout1 having the maximum value.

When the digital data (D0 to D5) is within the range of gray levels from “32” to “47”, as shown in FIG. 7, the bits S11 to S14, S1F, S21 to S24, and S2F are all converted to be “1”. The sub-current Iout1 by the circuit block C1 is the sum of the elemental currents i11 to i14 and i1F. The sub-current Iout2 by the circuit block C2 is the sum of the elemental currents i21 to i24 and i2F.

When the gray level is “32” to “47”, the bits S31 to S34 are converted so that the decimal value indicated by the four bits (S34 is the most significant bit) sequentially advances from “0” to “15”. Thus, the elemental currents i31 to i34 are appropriately selected by the circuit block C3, and hence the sub-current Iout3 is generated.

When the gray level is “32” to “47”, the bits S41 to S44 are converted to be “0”. Thus, the sub-current Iout4 by the circuit block C4 is zero.

Thus, the main current lout when the gray scale is within the range from “32” to “47” is generated by adding the sub-current Iout3, which is generated by adding the appropriately selected elemental currents i31 to i34 by the circuit block C3, to the sum of the sub-currents Iout1 and Iout2, both having maximum values. When the gray level is “32” (minimum value of the range allocated to the circuit block C3), more specifically, the sub-current Iout3 is zero. Thus, the main current lout can be indicated by the sum of the sub-currents Iout1 and Iout2, both having maximum values.

When the digital data (D0 to D5) is within the range of gray levels from “48” to “63”, as shown in FIG. 8, the bits S11 to S14, S1F, S21 to S24, S2F, S31 to S34, and S3F are all converted to be “1”. The sub-current Iout1 by the circuit block 1 is the sum of the elemental currents i11 to i14 and i1F. The sub-current Iout2 by the circuit block C2 is the sum of the elemental currents i21 to i24 and i2F. The sub-current Iout3 by the circuit block C3 is the sum of the elemental currents i31 to i34 and i3F.

When the gray level is within “48” to “63”, the bits S41 to S44 are converted so that the decimal value indicated by the four bits (S44 is the most significant bit) sequentially advances from “0” to “15”. In the circuit block C4, the elemental currents i41 to i44 are appropriately selected, and the sub-current Iout4 is generated.

The main current lout when the gray level is within the range from “48” to “63” is generated by adding the sub-current Iout4, which is generated by adding the appropriately selected elemental currents i41 to 44 by the circuit block C4, to the sum of the sub-currents Iout1, Iout2, and Iout3, all having maximum values. When the gray level is “48” (minimum value of the range allocated to the circuit block C4), more specifically, the sub-current Iout4 is zero. The main current lout is indicated by the sum of the sub-currents Iout1, Iout2, and Iout3, all having maximum values.

When the power supply circuit 7 generates the voltages V1 to V4 in which the relationship is V1<V2<V3<V4, the reference voltages VCS1 to VCS4 (VCF1 to VCF4) generated by the reference voltage generating circuit 320 have the relationship VCS1<VCS2<VCS3<VCS4 (VCF1<VCF2<VCF3<VCF4).

In this relationship, when the elemental currents i11 to i14, i1F, i21 to i24, i2F, i31 to i34, i3F, and i41 to i44 in the circuit blocks C1 to C4 have values shown in FIG. 12, the main currents lout corresponding to the gray levels “0” to “63” indicated by the digital data (D0 to D5) have values shown in FIG. 13. The gray level/main current characteristics are, as shown in FIG. 14, indicated by a simulated y curve generated by four straight lines.

The characteristics are described below. The main current lout when the gray level is within the range from “0” to “16” is the sub-current Iout1 generated by combining the appropriately selected elemental currents i11 to i14 and i1F by the circuit block C1. When the gray level is within this range, the main current Iout has an approximately linear characteristic within this range. The slope is determined by the reference voltage VCS1 (VSF1). Since the weights of the elemental currents i11 and i1F are “1”, the main current Iout when the gray level is “16” is on an extension of the characteristic of the gray levels from “0” to “15”.

Next, the main current lout when the gray level is within the range from “16” to “32” is the sum of the sub-current Iout1 having the maximum value in the circuit block C1 and the sub-current Iout2 generated by combining the appropriately selected elemental currents i21 to i24 and i2F by the circuit block C2. When the gray level is within this range, the main current lout has an approximately linear characteristic in this range, which is continuous with the approximately linear characteristic when the gray level is within the range from “0” to “16”. The slope of the main current Iout when the gray level is within the range from “16” to “32” is determined by the reference voltage VCS2 (VSF2). Since the weights of the elemental currents i21 and i2F are "1", the main current Iout when the gray level is "32" is on an extension of the characteristic of the gray levels from "16" to "31".

The main current lout when the gray level is within the range from "32" to "48" is the sum of the sub-currents Iout1 and Iout2 having maximum values and the sub-current Iout3 generated by combining the appropriately selected elemental currents i31 to i34 and i3F by the circuit block C3. When the gray level is within this range, the main current Iout has an approximately linear characteristic in this range, which is continuous with the approximately linear characteristic when the gray level is within the range from "16" to "32". The slope of the main current lout when the gray level is within the range from "32" to "48" is determined by the reference voltage VCS3 (VSF3).

The main current lout when the gray level is within the range from "48" to "63" is the sum of the sub-currents Iout1, Iout2, and Iout3 having maximum values and the sub-current Iout4 generated by combining the appropriately selected elemental currents i41 to i44 by the circuit block C4. When the gray level is within this range, the main current lout has an approximately linear characteristic in this range, which is continuous with the approximately linear characteristic when the gray level is within the range from "32" to "48". The slope of the main current lout when the gray level is within the range from "48" to "63" is determined by the reference voltage VCS4 (VSF4).

By adjusting the relationship among the reference voltages VCS1 to VCS4 (VCFL to VCF4) generated by the reference voltage generating circuit 320 using the voltages V1 to V4, the characteristic of the main current lout relative to the gray level can be variously set.

For example, when VCS1=VCS2=VCS3=VCS4, the main current lout increases, as shown in FIG. 15, approximately linearly over the whole range of gray levels "0" to "63". The slope changes in accordance with VCS1 (=VCS2=VCS3=VCS4).

When VCS1>VCS2>VCS3>VCS4, the characteristic of the main current Iout is such as that shown in FIG. 16. When VCS1 (VCS4)>VCS2 (=VCS3), the characteristic of the main current lout is such as that shown in FIG. 17.

In order to adjust the relationship among the reference voltages VCS1 to VCS4 (VCF1 to VCF4) generated by the reference voltage generating circuit 320, the voltages V1 to V4 generated by the power supply circuit 7 are set individually. For example, as the configuration for individually setting the voltage V1, an example shown in FIG. 18 can be used. Specifically, the output of an operational amplifier 71 is supplied as a negative feedback input using a variable resistor 73 and a resistor 75. The same applies to the other voltages V2, V3, and V4. In this configuration, the resistance of the variable resistor 73 can be adjusted manually or can be adjusted by an analog switch.

According to the current generating circuit 30, the characteristics of the main currents relative to the gray levels are represented by four continuous approximately linear lines. It is thus possible to simulate ϵ characteristics of the display panel 1 in various manners in accordance with the purpose and use.

According to the current generating circuit 30, 64 types of main currents Iout can be generated by four types of reference voltages using V1 to V4 and a logic power supply voltage. Thus, the number of necessary voltage sources can be very small. Thus, the configuration becomes simple, the power consumption can be reduced, and the durability can be enhanced.

The current generating circuit 30 generates the main currents Iout corresponding to 64 gray levels by combining the four sub-currents Iout1 to Iout4 generated by the circuit blocks C1 to C4. Alternatively, the number of circuit blocks can be increased (by decreasing the number of FETs 10*f* to 10*j* belonging to one circuit block), and smoother non-linear characteristics can be achieved. In contrast, the number of circuit blocks can be reduced (by increasing the number of FETs 10*f* to 10*j* belonging to one circuit block), and the conversion burden on the converter circuit 310 can be reduced (the number of data lines defining on/off of switches of the circuit block can be reduced).

Although FETs are used to generate elemental currents in the circuit blocks, bipolar transistors can be used alternatively.

The present invention is not limited to the above embodiment, and various applications and modifications can be made.

In the foregoing embodiment, the main current Iout is zero, which is the minimum value, when the gray level is "0" (see FIG. 13). By additionally providing an offset current circuit, such as that shown in FIG. 19, the value of the lower limit for the main current Tout can be defined by the voltage V0. In this configuration, the current flowing through the offset current circuit 51 is offset against the sum of the sub-currents Iout1 to Iout4 combined to form the main current Iout. Therefore, the minimum value of the main current lout can be set to the value of the lower limit instead of zero.

In the foregoing embodiment, when the scanning line 102 is selected, the currents to be supplied to the organic EL elements 1130 of the pixel circuits 110 located on the scanning line 102 is supplied via the data lines 104.

If the display panel 1 increases in size, the parasitic capacitance of the data lines 104 increases, and the necessary main current lout cannot be supplied immediately. It thus becomes difficult to perform high-speed driving. In order to address or solve this problem, as shown in FIG. 20, a pre-charge circuit 53 can be provided for each data line 104. The pre-charge circuit 53 includes an FET 532 to cause a pre-charge current Ip in accordance with a gate voltage Vpre to flow and a switch 534 to pre-charge the data line 104 by being turned on in response to a signal Dp before the main current lout flows through the data line 104 and to cause the pre-charge current Ip to flow through the data line 104.

When the data line 104 is pre-charged before the main current lout flows, the period required for the current flowing through the data line 104 to reach the target main current Iout can be reduced, compared with a case in which the pre-charge circuit 53 is not used. Accordingly, driving can be performed at a higher speed.

In the foregoing embodiment, the luminous control signals Vg1, Vg2, Vg3, . . . , Vgm are generated by inverting, by the scanning line driving circuit 2, the logical level of the scanning signals Y1, Y2, Y3, . . . , Ym and are supplied. Alternatively, the luminous control signals Vg1, Vg2, Vg3, . . . , Vgm can be supplied by a separate circuit. Alternatively, the luminous control signals Vg1, Vg2, Vg3, . . . , Vgm can be generated by reducing the periods during which the luminous control signals Vg1, Vg2, Vg3, . . . , Vgm are at the active level (H level).

In the electro-optical device 100 according to the foregoing embodiment, the current generating circuit 30, which is the feature of the present invention, is applied to the data line driving circuit of the organic EL panel. Alternatively, the current generating circuit can be applied to various display panels other than the organic EL panel, such as an FED (Field Emission Display).

Cases in which the electro-optical device 100 according to this embodiment is applied to electronic apparatuses will now be described.

FIG. 21 is a perspective view showing the configuration of a mobile personal computer to which the electro-optical device 100 is applied. In FIG. 21, a personal computer 2100 includes a main unit 2104 with a keyboard 2102 and the electro-optical device 100 as a display unit.

FIG. 22 is a perspective view showing the configuration of a cellular phone to which the foregoing electro-optical device is applied. In FIG. 22, a cellular phone 2200 includes a plurality of operation buttons 2202, an earpiece 2204, a mouthpiece 2206, and the electro-optical device 100.

FIG. 23 is a perspective view showing the configuration of a digital still camera having a finder to which the electro-optical device 100 is applied. Whereas a silver camera exposes a film to light using an optical image of a subject, a digital still camera 2300 uses an image pickup device, such as a CCD (Charge Coupled Device), to perform photoelectric conversion of an optical image of a subject and generates/stores an image pickup signal. The above-described electro-optical device 100 is provided on the back of a main portion 2302 of the digital still camera 2300. Since the electro-optical device 100 displays an image in accordance with the image pickup signal, the electro-optical device 100 functions as a finder to display the subject. A light receiving unit 2304, including an optical lens and the CCD, is provided on the front side of the main portion 2302 (the back side in FIG. 23).

When a user who wants to take a photograph confirms an image of the subject displayed on the electro-optical device 100 and presses a shutter button 2306, an image pickup signal generated by the CCD at that time is transferred and stored in a memory of a circuit board 2308.

In the digital still camera 2300, a video signal output terminal 2312 to perform external display and an input/output terminal 2314 for data communication are provided on the lateral side of a case 2302.

Electronic apparatuses to which the electro-optical device 100 is applicable include the personal computer shown in FIG. 21, the cellular phone shown in FIG. 22, the digital still camera shown in FIG. 23, a liquid crystal television, a viewfinder-type or a monitor-direct-viewing-type video cassette recorder, a car navigation system, a pager, an electronic notebook, an electronic calculator, a word processor, a workstation, a video phone, a POS terminal, and a device with a touch panel, for example. Needless to say, the electro-optical device 100 is applicable to display units of these and other various electronic apparatuses.

As described above, according to a current generating circuit of the present invention, the circuit configuration can be simplified, and the power consumption can be suppressed.

What is claimed is:

1. A current generating circuit, comprising:

a plurality of circuit blocks to output sub-currents by selecting elemental currents from among a plurality of elemental currents in accordance with input digital data, each of the plurality of sub-currents being generated based on a differing reference voltage; and a combining circuit to output a main current by combining the sub-currents, each of the circuit blocks generating the plurality of elemental currents by transistors having different gain coefficients.

2. The current generating circuit according to claim 1, the transistors including a combination of transistors in which the ratios of the gain coefficients are the binary weights.

3. The current generating circuit according to claim 1, the transistors being field effect transistors, and a common reference voltage being supplied to gate electrodes of the transistors of each of the circuit blocks.

4. The current generating circuit according to claim 1, further comprising an offset current path to define the value of a lower limit for the main current.

5. A semiconductor integrated circuit, comprising:

the current generating circuit as set forth in claim 1 integrated therein.

6. An electro-optical device, comprising:

a plurality of scanning lines;

a plurality of data lines;

a scanning line driving circuit to drive the scanning lines;

a data line driving circuit to drive the data lines; and electro-optical elements located at intersections of the scanning lines and the data lines, the data line driving circuit including the current generating circuit as set forth in claim 1 and supplying a main current generated by the current generating circuit to each of the data lines.

7. The electro-optical device according to claim 6, the electro-optical elements being driven elements driven by current.

8. The electro-optical device according to claim 7, the driven elements being organic electro-luminescence elements.

9. The electro-optical device according to claim 8, further comprising:

a memory to store data to define brightness gray levels of the organic electro-luminescence elements; and a control circuit to read the data from the memory and to supply the data as the digital data to the data line driving circuit.

10. The electro-optical device according to claim 6, further comprising an oscillator circuit to supply a reference operation signal functioning as an operation reference.

11. An electronic apparatus, comprising:

the electro-optical device as set forth in claim 6.

12. A current generating circuit, comprising;

a plurality of circuit blocks to generate sub-currents; and a combining circuit to output a main current by combining the sub-currents generated by the circuit blocks, each of the circuit blocks being allocated to a corresponding range obtained by dividing a possible range of input digital data, when the digital data value is below the range allocated to each of the circuit blocks, the circuit block generating an approximately zero sub-current, when the digital data value is within the range allocated to each of the circuit blocks, the circuit block generating a sub-current having an approximately linear characteristic in accordance with the digital data, and when the digital data value is above the range allocated to each of the circuit blocks, the circuit block generating a sub-current corresponding to the minimum value of the range of digital data allocated to an upper block adjacent to the circuit block.

13. The current generating circuit according to claim 12, the approximately linear characteristic of the circuit block being set individually for each of the circuit blocks.

* * * * *